US010620597B2

(12) United States Patent
Rehor

(10) Patent No.: US 10,620,597 B2
(45) Date of Patent: Apr. 14, 2020

(54) GRAY BOX MODEL ESTIMATION FOR PROCESS CONTROLLER

(71) Applicant: Honeywell spol. s.r.o., Morris Plains, NJ (US)

(72) Inventor: Jiri Rehor, Cernosice (CZ)

(73) Assignee: Honeywell spol. s r. o., Prague (CZ)

( * ) Notice: Subject to any disclaimer, the term of this patent is extended or adjusted under 35 U.S.C. 154(b) by 786 days.

(21) Appl. No.: 15/162,757

(22) Filed: May 24, 2016

(65) Prior Publication Data
US 2016/0357166 A1 Dec. 8, 2016

(30) Foreign Application Priority Data

Jun. 3, 2015 (EP) ..................................... 15170586

(51) Int. Cl.
*G05B 19/042* (2006.01)
*G06F 17/50* (2006.01)
(52) U.S. Cl.
CPC ........... *G05B 19/042* (2013.01); *G06F 17/50* (2013.01); *G05B 2219/23456* (2013.01)
(58) Field of Classification Search
None
See application file for complete search history.

(56) References Cited

U.S. PATENT DOCUMENTS

| 9,235,657 B1 * | 1/2016 | Wenzel | G06F 17/50 |
| 2010/0049369 A1 | 2/2010 | Lou et al. | |
| 2012/0065783 A1 * | 3/2012 | Fadell | G05D 23/1917 |
| | | | 700/276 |

OTHER PUBLICATIONS

JiříRehoř et al., A Practical Approach to Grey-box Model Identification, Sep. 2, 2011, The International Federation of Automatic Control, 10776-10781 (Year: 2011).*
Erik Wernholt, Nonlinear Gray-Box Identification Using Local Models Applied to Industrial Robots, Nov. 15, 2010, Linkoping University, 1-15 (Year: 2010).*
"European Application Serial No. 15170586.0, Response filed Jun. 7, 2017 to Extended European Search Report dated Dec. 15, 2015", 13 pgs.
"European Application Serial No. 15170586.0, Extended European Search Report dated Dec. 15, 2015", 6 pgs.
(Continued)

*Primary Examiner* — Omar F Fernandez Rivas
*Assistant Examiner* — Michael Edward Cocchi
(74) *Attorney, Agent, or Firm* — Schwegman Lundberg & Woessner, P.A.

(57) ABSTRACT

Parameters are estimated for continuous time linear gray-box models using a fast sensitivity evaluation, which is a measure of how output of the model changes with changes in parameters. A two-step parameter estimation of non-linear models, such as a steady-state model and dynamical model, is performed. A parameter estimation algorithm is employed for estimation of non-linear model parameters via local approximation at different system operating levels or operating set-points. The parameter estimation task is improved by an efficient parameter estimation of linear, continuous-time, stochastic, gray-box models. It is further improved by using a two-step parameter estimation of non-linear, continuous-time, gray-box models. It is still further improved by employing the efficient parameter estimation algorithm for the non-linear gray-box models.

3 Claims, 12 Drawing Sheets

(56) References Cited

OTHER PUBLICATIONS

Mukhopadhyay, Vivek, "Digital Robust Control Law Synthesis Using Constrained Optimization", *Journal of Guidance and Control and Dynamics*, 12(2), (1989), 175-181.

Tan, Kay Chen, et al., "Evolutionary grey-box modelling for practical system", *Genetic Algorithms in Engineering System: Innovations and Applications*, (1997), 369-375.

* cited by examiner

| INPUTS | OUTPUTS |
|---|---|
| u1 - COAL (FUEL) [kg/s] | y1 - HEADER PRESSURE [Mpa] |
| u2 - TOTAL STEAM DEMAND [kg/s] | y2 - STEAM FLOW [kg/s] |

| NAME | MIN | INIT | MAX | DESCRIPTION |
|---|---|---|---|---|
| KF | 0.01 | 0.5 | 1 | FUEL TO STEAM GAIN |
| TF | 10 | 40 | 5e2 | FUEL TIME CONST. |
| VD | 1e2 | 1e3 | 1e5 | DRUM (VOLUME) CONST. |
| VH | 10 | 5e2 | 1e4 | HEADER (VOLUME) CONST. |
| KV | 40 | 80 | 100 | VALVE CONST. |
| *F0* | *60* | *60* | *60* | *NOMINAL STEAM FLOW* |

$Q_c = \text{diag}(1e^{-3}[1\ 1\ 1]^T)$

*FIG. 6*

GRAY BOX MODEL ESTIMATION FOR PROCESS CONTROLLER

BACKGROUND

Systems, such as industrial process systems, utilize advanced controllers to control processes carried out by the systems. Controllers are purchased by many companies having a wide variety of systems to control, from boilers and oil refineries to ice cream manufacturing, heating and cooling plants, and packaging plants to name a few. Such controllers utilize many parameters that are measured values corresponding to different pieces of equipment making up the system. The measured values may correspond to temperatures, pressures, flow rates, and many other measurable and estimated values for parameters that cannot be directly measured. Variables may be set by the controllers to control the processes. To help set the variables, the systems may be modeled using complex modelling techniques. The modelling may be referred to as system identification.

System identification is about science (algorithms) and art (experience). Both parts are indispensable when developing mathematical models. In a white-box model, an engineer knows the system/process, all parameter are known or measurable, and the model may be constructed using first-principles knowledge. In a gray-box model, some of the parameter are unknown and must be estimated using data. Physically well-founded models are available for use, but there is no systematic approach that may be used to estimate gray-box model parameters. In a black-box model, the engineer knows only experimental data and the model is built using some standard regression models. Some well-designed algorithms exist for parameter estimation of black-box models.

At present, more and more complex models are being developed as more complex systems are being controlled or observed. It is apparent that such models require more information to be correctly identified. The information can be collected by measuring experimental/operational data, but this can be intractable or expensive. On the other hand, a substantial piece of information comes from first-principle modeling. Using this information in model derivation results in more robust models with respect to errors in data, and it also lowers the demand on the amount of experimental data required.

A natural way to describe first-principle models is by using a gray-box modeling approach. The gray-box model (GBM) effectively captures user's knowledge about the system, which is typically being described by a set of parameterized differential equations. The GBM is parameterized by a vector of unknown parameters that are to be identified using experimental data.

Whereas the GBM definition falls into the "art" part of the system identification, the parameter estimation problem is about the "science." Looking for the optimal value of GBM parameters results in a hard optimization task, which is the main drawback of the gray-box modeling approach.

SUMMARY

A method includes using first principles and engineering knowledge to define a continuous time nonlinear gray-box model of a system performing a process, defining a numerically tractable optimization problem for parameter estimation of the nonlinear gray-box model, tuning a vector of parameters of a static model of the nonlinear gray-box model, and extending the vector of parameters of the static model to a dynamic model by fitting measured transient data from the process.

An advanced controller having a parameterized model for controlling a system to control a process, the controller including processor and a storage device having code and data to define a gray-box model of the system and corresponding parameters for the gray-box model. The parameters are determined in accordance with a method at least partially performed by a programmed computer. The method includes defining a numerically tractable optimization problem for parameter estimation of a general nonlinear gray-box model, tuning parameters of a static model of the nonlinear gray-box model, and extending the parameters of the static model to a dynamic model by fitting measured transient data from the process. A method includes estimating a non-linear steady state model representative of a system performing a process using steady-state data, the model providing tuned static parameters for an advanced controller to control the system, and using the non-linear steady state model with the tuned static parameters to tune dynamic gray-box model parameters using sub-sequences of transient experimental data.

An advanced controller having a parameterized model for controlling a system to perform a process. The controller includes a processor, and a storage device having code and data to define a dynamic gray-box model of the system and corresponding dynamic gray-box parameters for the gray-box model, wherein the parameters are determined in accordance with a method at least partially performed by a programmed computer. The method includes estimating a non-linear steady state model representative of a system performing a process using steady-state data, the model providing tuned static parameters for an advanced controller to control the system, and using the non-linear steady state model with the tuned static parameters to provide dynamic gray-box model parameters using sub-sequences of transient experimental data.

A method includes performing a steady-state model estimation to obtain a vector of steady state parameters for a non-linear model representative of a system controlled by an advanced controller to perform a process, and tuning the vector of steady-state parameters by a using local approximation for estimation of non-linear model parameters at different operating levels of the system to obtain local linear model vectors of gray-box parameters for the advanced controller.

An advanced controller having a parameterized model for controlling a system to perform a process includes a processor and a storage device having code and data to define a dynamic gray-box model of the system and corresponding dynamic gray-box parameters for the gray-box model, wherein the parameters are determined in accordance with a method at least partially performed by a programmed computer.

The method includes performing a steady-state model estimation to obtain a vector of steady state parameters for a non-linear model representative of a system controlled by the advanced controller, and tuning the vector of steady-state parameters by a using local approximation for estimation of non-linear model parameters at different operating levels of the system to obtain local linear model vectors of gray-box parameters for the advanced controller.

BRIEF DESCRIPTION OF THE DRAWINGS

FIG. 6 is a table illustrating inputs, outputs, and parameters according to an example embodiment.

DETAILED DESCRIPTION

Figure 1:
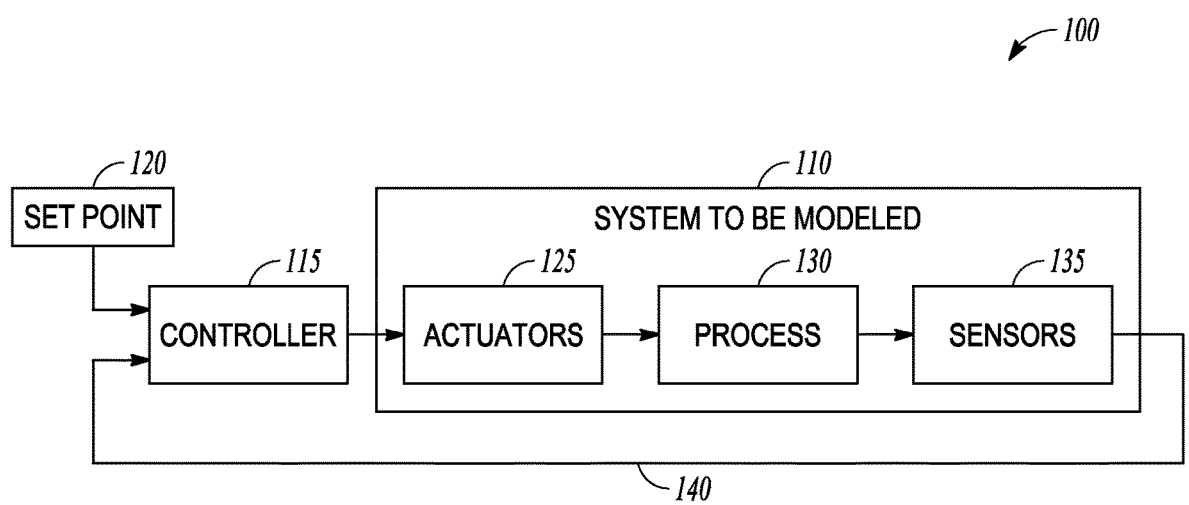
FIG. 1 is a block diagram illustrating a typical control structure according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media or computer readable storage device such as one or more memory or other type of hardware based storage devices, either local or networked. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Gray-box models are created for use by advanced controllers which use models to compute control signals to control a process performed by a system such as a boiler or other systems that include multiple components operating together to perform a process. Other uses of the models include model simulation and error detection, such as system malfunction detection, sensor error detection and other types of error detection. Many controllers utilize classic simple types of control, such as those based on proportional, integral, and derivative (PID) algorithms. More advanced controllers utilize a model of a system that depends on estimation of multiple parameters for the model to effectively control the system implementing the process.

Generally speaking, the model of a system and the controller can be considered independently. In practical application the process of developing models for control is iterative. Testing is performed to determine whether the model is good enough to be used by a controller. Various embodiments address the modeling phase independent of the controller.

Modelling may be performed to obtain a good model of a system (process), such that the output of the system (process) can be precisely predicted using current model state and future (manipulated) inputs.

"Good model"=a model which provides reliable predictions of the outputs of the system.

"Current model state"=state of the dynamical model, which accumulates the past history of the model, such that the future behavior is only a function of this state and future inputs to the system.

Such models are typically used in advanced controllers to compute the control actions (the future manipulated inputs) to the system so that the system behaves optimally.

One goal is to find this model, which can be used e.g. in the controller to predict the behavior of the system and thus to optimize the control action. To compose the model, some prior information about the system and set of measured input/output data, which is typically gathered from identification experiments is used.

Having data and prior knowledge a natural way to obtain a model is using the gray-box modelling. Gray-box models have a given structure that comes from the prior information/engineering knowledge and list of (partially) unknown parameters, which have to be estimated using data. This estimation is done off-line and only the resulting model is provided to a controller. The drawback of this modelling method is the resulting non-convex and non-linear optimization task, which has to be solved by a computer (program) to find optimal values of the parameters. Optimal values, in this case, mean that the predicted outputs of the model are in accordance with the measured outputs of the real system.

In some embodiments described in the present application, the hard (off-line) optimization task of finding the optimal parameters of the gray-box model is solved. The solutions can be described from above ("what I want") down to ("how to do it") as follows:

Having a nice designed (i.e. numerically tractable) optimization problem for parameter estimation of a general (non-linear) gray-box model.

A two-step identification (tune the static model first, then extend it to a dynamic model by fitting transient data).

Fitting transient data using local linear approximation of the non-linear gray-box model and thus avoiding computationally expensive numerical integration.

Support the optimization algorithm by providing sensitivity to the optimizing parameters. In other words, provide a gradient of a cost function. The gradient is computed using prediction errors and their sensitivities to the parameters.

Fast evaluation of the computation of the prediction errors and their sensitivities (of the locally linearized gray-box models) using an extended discrete-time linear stochastic model.

Computation of the extended discrete-time linear stochastic model using the continuous-time gray-box model, as was provided by the user.

In various embodiments, parameters may be efficiently estimated for continuous time linear gray-box models using a fast sensitivity evaluation, which is a measure of how output of the model of the system changes with changes in parameters. In a further embodiment, a two-step parameter estimation of non-linear models, such as a steady-state model and dynamical model, is performed. In still a further embodiment, an efficient parameter estimation algorithm is employed for estimation of non-linear model parameters via local approximation at different system operating levels or operating set-points. The above embodiments provide a fast and reliable identification of first-principle models.

A block diagram of a system to be controlled is illustrated in FIG. 1 at 100. A system 110 to be modeled is controlled by a controller 115 to a give setpoint 120. The system to be modeled may includes actuators 125 that are coupled to receive control signals from controller 115, a process 130, and sensors 135 which provide sensed values representative of the system 110 to the controller via feedback 140. For a given set point 120, the controller 115 uses the sensed values to evaluate a control action to achieve the set point. In a discrete time controller 115, the input and output signals of the controller 115 are discrete-time signals. The process 130 is usually a continuous-time process which is being manipulated using the actuators 125 and periodically measured by the sensors 135.

The system 130 may be any type of system that requires a controller to operate the system to perform a process properly and in an optimal manner. Example systems range from industrial boilers and oil refineries to ice cream manufacturing, heating and cooling plants, and packaging plants to name a few. Variability in input and environmental conditions may lead to difficulty of control of such systems. Many sensors 135 may be used to measure variables in the system, such as temperatures, pressures, flow rates. Such measurements are generally provided to the controller 115 to enable the controller to react to changes to obtain and maintain a desired set point 120 of the system, which again may be measured by the sensors.

A natural way to describe first-principle models for systems is by using a gray-box modeling approach. The gray-box model (GBM) effectively captures a user's knowledge about the system, which is typically described by a set of parameterized differential equations. The GBM is parameterized by a vector of unknown parameters that are to be estimated using experimental data.

In various embodiments, there are several improvements which may be used to enhance the performance of the parameter estimation task. One improvement includes efficient parameter estimation of linear, continuous-time, stochastic, gray-box models. A further improvement includes a two-step parameter estimation of non-linear, continuous-time, gray-box models. Yet another improvement includes employing the efficient parameter estimation algorithm for the non-linear gray-box models.

Figure 2:
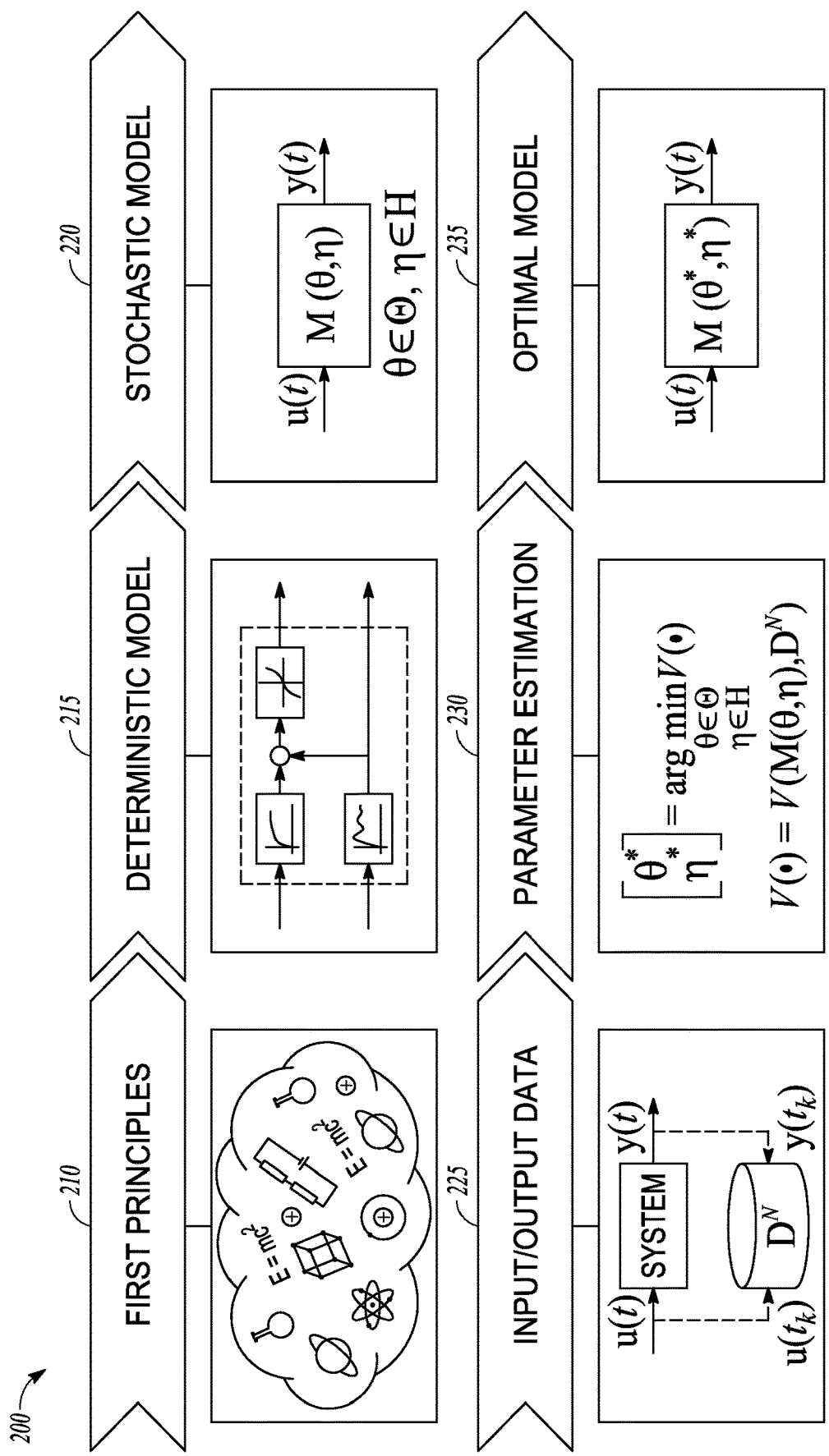
FIG. 2 is a block flow diagram of a method for performing linear gray box model identification according to an example embodiment.

Parameter Estimation of Linear Models:

FIG. 2 is a block flow diagram of a method 200 for estimating parameters for linear models. First principles (the assumptions that arise from the laws of physics of the system and process) as well as the engineering knowledge (empirical laws discovered by observation) are used at 210 to determine a linear time-invariant (LTI) GBM deterministic structure 215 defined by a set of first order differential equations $$\dot{x}(t)=A(\theta)x(t)+B(\theta)u(t),$$

$$y(t)=C(\theta)x(t)+D(\theta)u(t). \quad (2.1)$$

where $x(t) \in R^{n_x}$ denotes system state, $\dot{x}(t) = \partial x(t)/\partial t$ is the state time derivative, $u(t) \in R^{n_x}$ denotes system measured input, $y(t) \in R^{n_y}$ denotes system measured output and $\theta \in R^{n_x}$ denotes constant system parameters. The unknown parameters are usually constrained to be within a set of feasible values, generally $\theta \in \Theta$. $A(\theta) \in R^{n_x \times n_x}$, $B(\theta) \in R^{n_x \times n_u}$, $C(\theta) \in R^{n_y \times n_x}$, and $D(\theta) \in R^{n_y \times n_u}$ are parameterized system matrices of a deterministic description of the model.

The goal is to estimate the model parameters at 230 using measured (experimental) data 225, which may be obtained from sensors 135 to arrive at a parameterized model 235 in one embodiment:

$$D^N = \{U^N, Y^N\}, U^N = \{u(0), \ldots, u(N-1)\}, Y^N = \{y(0), \ldots, y(N-1)\}. \quad (2.2)$$

Here $D^N$ denotes measured input/output data sequence of N samples.

Due to the stochastic nature (may not be precisely predicted) of the measured data and unmeasured disturbances, the above mentioned deterministic LTI GBM 215 is not sufficient for a good parameter estimation. A stochastic model 220 should be introduced.

Stochastic Model:

It is commonly known that choosing a right noise model is helpful in parameter estimation. Defining the noise properties within the GBM is a bit tricky. There is usually a good knowledge of the deterministic part of the model; however, the stochastic part is typically hidden. The noise model may be utilized to set up filters, which are employed to estimate the current state of the system x(t). In the parameter estimation, the noise model may be used mainly to correctly estimate model parameters, whereas in the controller settings, parameters to assumed to be valid and estimate (or filter) the current state. This state is used together with the model to predict the output behavior of the system and thus; to find an optimal control sequence.

Consider a continuous-time linear stochastic model with a discrete time measurements $$dx(t)=Ax(t)dt+Bu(t)dt+dv(t),$$

$$y(t_k)=Cx(t_k)+Du(t_k)+w(t_k),$$

$$t_k=k \cdot T_s, \text{ where } k \in Z, T_s > 0, \quad (2.3)$$

where the matrices A, . . . , D are taken from the deterministic description of the GBM, $T_s$ is a sampling time, k is an integer, $v(t) \in R^{n_x}$ is a Wiener process with independent increments $E\{dv(t)\}=0$, $E\{dv(t)dv^T(t)\}=Q_c dt$ and $e(t_k) \in R^{n_y}$ is a discrete-time white Gaussian measurement noise $e(t_k) \sim N(0,R)$. It is also assumed that the process and measurement noise are mutually independent. Thus the stochastic properties are defined by the covariance matrices $Q_c=Q_c^T \in R^{n_x \times n_x}$ and $R=R_c^T \in R^{n_y \times n_y}$. To distinguish between deterministic and stochastic parameters, we use another vector of parameters $\eta \in R^{n_h}$ to parameterize matrices $Q_c=Q_c(\eta)$ and $R=R(\eta)$.

Note that defining the process noise in the continuous-time domain is unusual in system identification. Data are typically collected using regular sampling; i.e. a discrete-time domain appears to be more convenient. On the other hand, continuous-time domain has an advantage in simple de-correlation of the noise-to-state impacts (compared to a discretized model definition), which issues in a smaller number of stochastic parameters required.

Due to the discrete-time measurements, it is convenient to translate the model 220 into the discrete-time domain. This can be easily done for the case of LTI models.

Discrete-Time Domain Translation (Discretization):

Translation of the model from the continuous time domain to the discrete time domain and model performance analysis may also be performed. Consider the stochastic model (2.3) to be periodically sampled with a sampling interval $T_x$. The adequate discrete-time linear stochastic model has a description $$x(k+1)=Mx(k)+Nu(k)+v(k),$$

$$y(k)=Cx(k)+Du(k)+w(k), \quad (2.4)$$

where $x(k)=x(t_k)$, $t_k=kT_s$ is a discrete-time state, and $u(k)=u(\tau)$, $\tau=[kT_s; (k+1)T_s)$ is a piece-wise constant input. The discrete-time noises are considered to have the Gaussian distribution and to be white; i.e.

$$E\left\{\begin{pmatrix} v(k) \\ w(k) \end{pmatrix}\right\} = \begin{pmatrix} 0 \\ 0 \end{pmatrix} \text{ a } \operatorname{cov}\left\{\begin{pmatrix} v(k) \\ w(k) \end{pmatrix}\right\} = \begin{pmatrix} Q & 0 \\ 0 & R \end{pmatrix}\delta_K(k). \quad (2.5)$$

The discrete-time matrices are $$M=\exp(AT_s), \; N=\int_0^{T_s}\exp(A\tau)d\tau B,$$

$$Q=\int_0^{T_s}\exp(A\tau)Q_c\exp(A^T\tau)d\tau. \quad (2.6)$$

Note that the above equation can be easily solved using an augmented matrix exponential $$\begin{pmatrix} M & N \\ 0 & I \end{pmatrix} = \exp\left(\begin{pmatrix} A & B \\ 0 & 0 \end{pmatrix}T_s\right), \quad (2.7)$$

and for the discrete-time covariance matrix we can use e.g. the following approximation $$Q \doteq Q_cT_s + (AQ_c + Q_cA^T)\frac{T_s^2}{2} + AQ_cA^T\frac{T_s^3}{3}. \quad (2.8)$$

Parameter Estimation:

The continuous-time LTI stochastic model and its discrete-time counterpart have been defined. Note that the discrete-time model (2.4) is parameterized by the same vector of deterministic parameters θ as the original continuous-time model (2.1); i.e, $$M=M(\theta,T_s) \; N=N(\theta T_s)$$

$$C=C(\theta) \; D=D(\theta) \quad (2.9)$$

and that the discretized process noise matrix Q depends on both η and θ

$$Q=Q(\eta,\theta). \quad (2.10)$$

A typical approach to parameter estimation problem is by using the prediction error method (PEM). The PEM tries to minimize (in some way) the prediction errors $$e(k)=y(k)-\hat{y}(k|k-1), \quad (2.11)$$

where y(k) is a measured output and $$\hat{y}(k|k-1)=E\{y(k)|D^{k-1},u(k)\} \quad (2.12)$$

is the predicted output (the conditional expectation of the output) at time instant k, predicted using input/output data up to the time instant k−1 and input at time instant k. The predicted output is in this case defined by the well-known Kalman filter as follows $$\hat{x}(k+1|k)=M\hat{x}(k|k-1)+Nu(k)+K(k)(y(k)-\hat{y}(k|k-1)),$$

$$\hat{y}(k|k-1)=C\hat{x}(k|k-1)+Du(k). \quad (2.13)$$

Here, $\hat{x}(k+1|k)$ is a predicted state defined similarly to (2.12) and K(k) is a Kalman's gain matrix driven by a discrete-time Riccati's equation (The cross-covariance matrix S is considered to be zero. The approach can be easily extended to non-zeros S, which appears e.g. when a realistic sampling is considered.)

$$K(k) = (MP(k|k-1)C^T + S)(CP(k|k-1)C^T + R)^{-1}, \quad (2.14)$$

$$P(k+1|k) = MP(k|k-1)M^T + Q - (MP(k|k-1)C^T + S)(CP(k|k-1)C^T + R)^{-1}(MP(k|k-1)C^T + S)^T.$$

The P(k+1|k) corresponds to a covariance matrix of the state estimate.

The prediction error is a preliminary part for any PEM that will use the LTI GBM and measured data to estimate unknown (or uncertain) parameters. The basic algorithm works as follows:

> 1. Define an initial estimate $p_0 = [\theta_0^T \eta_0^T]^T$
> 2. Choose a PEM cost function
> $$p_0 = [\theta_0^T \eta_0^T]^T$$
> 3. Look for an optimal value of $p^*$, which minimize the PEM cost function
> $$p^* = \arg\min_p V(p, e(0), \ldots, e(N-1))$$

Here, p is a vector combining all unknown parameters, e.g. $p=[\theta^T \eta^T]^T$ and prediction errors $e(0), \ldots, e(N-1)$ are function of the parameter values.

It is important to mention that the resulting optimization problem is very difficult and is the main drawback of the gray-box modeling approach. The optimization problem is non-linear and non-convex with all its issues, such as multiple local minima, iterative optimization, computationally demanding task, and no certificate of global minima nor guarantee of reaching a local minima.

These issues cannot be solved in general, but some aids can be provided. Approaching the global optima can be supported by a careful initial estimation of model parameters, which belongs to the "art" part of the system identification. From the "science" point of view, the computationally demanding iterative optimization should be refined as much as possible.

Sensitivity of Prediction Errors:

When looking for an iteration update during the parameter optimization a substantial piece of information is a sensitivity (or gradient) of the criterial function $V(p,e(0), \ldots, e(N-1))$ with respect to parameter p $$V_p = \frac{\partial V}{\partial p^T} = \left[\frac{\partial V}{\partial p_1}, \ldots, \frac{\partial V}{\partial p_{n_p}}\right]. \quad (2.15)$$

The difficulty in evaluating the previous expression comes from a complex dependence of the prediction errors to parameters in p. Let $p \in \{p_1, \ldots, p_{n_p}\}$ be any parameter in the combined parameter vector, then the sensitivity with respect to parameter "p" is defined as follows $$e_p = \frac{\partial e(k)}{\partial p} = \frac{\partial}{\partial p}(y(k) - \hat{y}(k|k-1)) = -\frac{\partial \hat{y}(k|k-1)}{\partial p}. \quad (2.16)$$

When a solution to the previous equation is found, the solution to (2.15) is usually obvious. The inventors have found no systematic approach to this for the case of linear, continuous-time, stochastic GBMs.

Suppose that we know the initial state exactly (Initial state can be also considered as an additional unknown vector of parameters); i.e.

$$\hat{x}(0|-1) = x_0, \; P(0|-1) = 0 \quad (2.17)$$

then the Riccati's equation (2.14) becomes an algebraic equation $$K = (MPC^T + S)(CPC^T + R)^{-1},$$

$$P = MPM^T + Q - K\Sigma K^T,$$

$$\Sigma = CPC^T + R, \quad (2.18)$$

and the output predictor is an LTI model $$\hat{y}(k|k-1) = C\hat{x}(k|k-1) + Du(k),$$

$$\hat{x}(k+1|k) = M\hat{x}(k|k-1) + Nu(k) + K(y(k) - \hat{y}(k|k-1)). \quad (2.19)$$

Let the sensitivity of the state vector with respect to a parameter $p_i$ be $$\xi_i = \frac{\partial x}{\partial p_i} \quad (2.20)$$

and the sensitivity of the output with respect to parameter $p_i$ is $$\psi_i = \frac{\partial y}{\partial p_i}. \quad (2.21)$$

Now, using the chain rule, the output sensitivities can be computed using the augmented system as follows $$\begin{pmatrix} \hat{x}(k+1|k) \\ \xi_i(k+1|k) \end{pmatrix} = \begin{pmatrix} M & 0 \\ M_i & M \end{pmatrix}\begin{pmatrix} \hat{x}(k|k-1) \\ \xi_i(k|k-1) \end{pmatrix} + \begin{pmatrix} N \\ N_i \end{pmatrix}u(k) + \begin{pmatrix} K & 0 \\ K_i & K \end{pmatrix}\begin{pmatrix} y(t) - \hat{y}(k) \\ -\hat{\psi}(k) \end{pmatrix}, \quad (2.22)$$

$$\begin{pmatrix} \hat{y}(k) \\ \hat{\psi}_i(k) \end{pmatrix} = \begin{pmatrix} C & 0 \\ C_i & C \end{pmatrix}\begin{pmatrix} \hat{x}(k|k-1) \\ \xi_i(k|k-1) \end{pmatrix} + \begin{pmatrix} D \\ D_i \end{pmatrix}u(k),$$

where the subscript $(_i)$ indicates the partial derivative with respect to parameter $p_i$; i.e., $X_i = \partial/\partial p_i X$, $X \in \{M, N, C, D, K\}$. The original problem was translated into: "How to evaluate partial derivatives of these matrices", whereas for the matrices of the continuous-time LTI system (2.1) this can be easily computed, in the case of the discrete-time matrices M, N and K it becomes more involving.

Lemma 1: A partial derivative of the discrete-time matrices $M_i$ and $N_i$ can be evaluated using matrix exponential as follows:

$$\begin{pmatrix} M & 0 & N \\ M_i & M & N_i \\ 0 & 0 & I \end{pmatrix} = \exp\left(T_s \begin{pmatrix} A & 0 & B \\ A_i & A & B_i \\ 0 & 0 & 0 \end{pmatrix}\right). \quad (2.23)$$

Finally, the evaluation of the partial derivatives of the Kalman gain matrix K may be performed. Looking at (2.18) it is seen that the matrix K is a function of the deterministic as well as the stochastic parameters.

Sensitivity of the Riccati's Equation

Lemma 2: A partial derivative of matrix K can be evaluated by solving the following Lyapunov's equation $$P_i = \bar{A}P_i\bar{A}^T + \bar{Q}_i, \quad (2.24)$$

where $$\bar{A} = M - KC,$$

$$\bar{A}_i = M_i - KC_i,$$

$$\bar{Q} = \bar{A}_i P \bar{A}^T + \bar{A}P\bar{A}_i^T + Q_i. \quad (2.25)$$

The partial derivative of the covariance matrix will be $$\Sigma_i = C_i PC^T + CP_i C^T + CPC_i^T, \quad (2.26)$$

and the partial derivative of the Kalman gain will be $$K_i = [\bar{A}_i PC^T + \bar{A}(P_i C^T + PC_i^T)]\Sigma^{-1}, \quad (2.27)$$

The algebraic Riccati's equation is defined as $$K = MPC^T(CPC^T + R)^{-1},$$

$$P = MPM^T + Q - K\Sigma K^T,$$

$$\Sigma = CPC^T + R. \quad (2.28)$$

The system matrices M and C are functions of unknown parameters $\theta$, the covariance matrix of measurement noise, R, is a function of $\eta$ and covariance matrix of process noise, Q, is a function of both $\theta$ and $\eta$ (see (2.8)). Consider that all partial derivatives of matrices M, C, Q and R are known, then by differentiating the first equation in (2.28) we obtain $$P_q = \frac{\partial}{\partial q}(MPM^T) + Q_q - \frac{\partial}{\partial q}(K\Sigma K^T), \quad (2.29)$$

where the inner terms are $$\frac{\partial}{\partial q}(MPM^T) = M_q PM^T + MP_q M^T + MPM_q^T, \quad (2.30)$$

and

-continued $$\frac{\partial}{\partial \theta}(k\Sigma K^T) = \frac{\partial}{\partial \theta}\left[(MPC^T + S)\Sigma^{-1}(MPC^T + S)^T\right] \quad (2.31)$$

$$= \left[\frac{\partial}{\partial \theta}(MPC^T + S)\right]K^T + K\left[\frac{\partial}{\partial \theta}(MPC^T + S)\right]^T -$$

$$K\left(\frac{\partial}{\partial \theta}\Sigma\right)K^T$$

$$= [M_q PC^T + MP_q C^T + MPC_\theta^T]K^T + K[\,]^T -$$

$$K(C_q PC^T + CP_q C^T + CPC_q^T)K^T$$

$$= MP_q C^T K^T + KCP_q M - KCP_q C^T K^T +$$

$$+ [M_q PC^T + MPC_q^T - KCPC_\theta^T]K^T +$$

$$K[M_q PC^T + MPC_q^T - KCPC_q^T]^T.$$

Substituting (2.30) into (2.29) results in $$P_q = M_q PM^T + MP_q M^T + MPM_q^T + MP_q C^T K^T + KCP_q M - \quad (2.32)$$

$$KCP_q C^T K^T + + [M_q PC^T + MPC_q^T - KCPC_q^T]K^T +$$

$$K[M_q PC^T + MPC_q^T - KCPC_q^T]^T + Q_q$$

$$= (M - KC)P_q(M - KC)^T + (M_q - KC_q)P(M - KC)^T +$$

$$(M - KC)P(M_q - KC_q)^T + Q_q.$$

The previous equation can be rewritten as Lyapunov's equation $$P_i = \overline{A}P_i\overline{A}^T + \overline{Q}_i, \quad (2.33)$$

where $$\overline{A} = M - KC,$$

$$\overline{A}_i = M_i - KC_i,$$

$$\overline{Q} = \overline{A}_i P\overline{A}^T + \overline{A}P\overline{A}_i^T + Q_i. \quad (2.34)$$

Summarizing the previous results, it may be observed that the sensitivity of the prediction errors can be computed iteratively using augmented system (2.22), partial derivatives of the discrete-time (deterministic) matrices can be solved using augmented matrix exponential (2.23), and partial derivatives of the Kalman gain matrix K can be computed by solving Lyapunov's (linear) equation (2.24) and by evaluating (2.27).

Maximum-Likelihood Estimation

Figure 3:
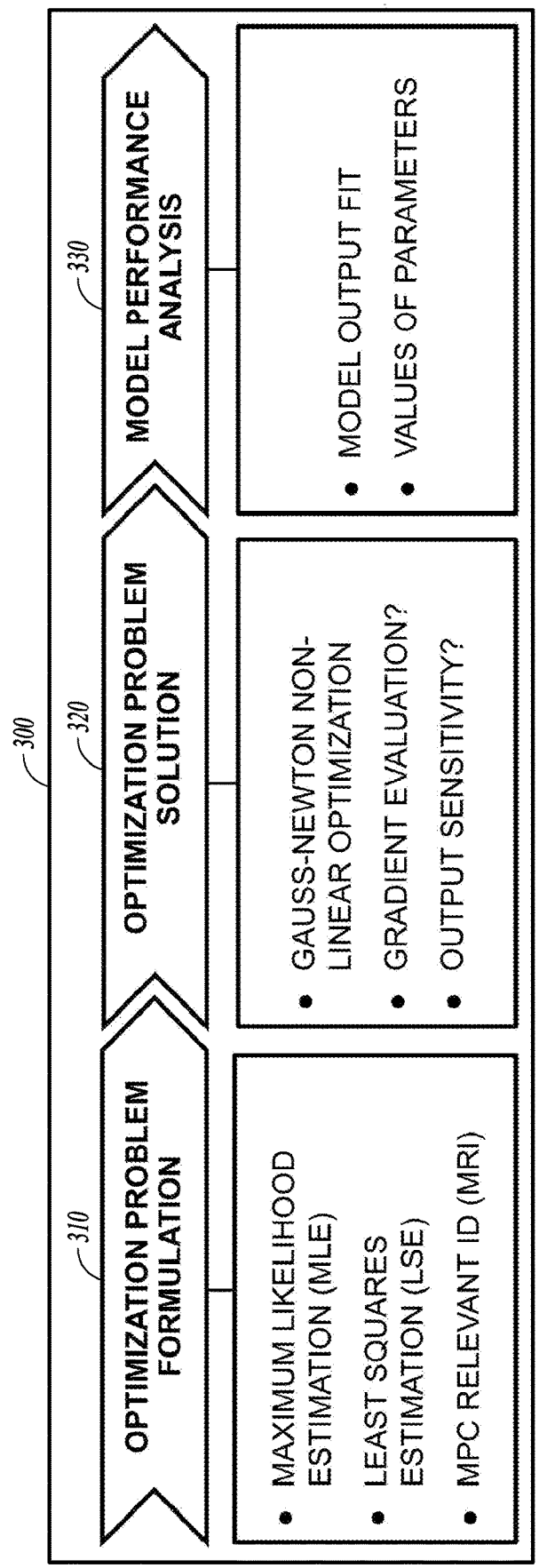
FIG. 3 is a block flow diagram of a method of selecting an optimization problem formulation, solution, and performing model performance analysis according to an example embodiment.

FIG. 3 is a block flow diagram of a method 300 of further optimization of the identified gray-box model. In this section the Maximum-Likelihood Estimation (MLE) approach 310 that uses the previously defined sensitivity evaluation will be introduced for optimization of the problem formulation as an example of how to make use of the sensitivity evaluation. In further embodiments, other prediction error minimization approaches may be used, such as least squares estimation.

The goal is to find a parameters $\theta$ and $\eta$ of LTI stochastic system (2.3). Here we consider $Q_c$ to be parameterized by a vector of unknown parameters $\eta \in R^{n_s}$, and for simplicity let R be a fixed (known) matrix.

The goal is to find a vector of parameters that maximize the following likelihood function $$L(\theta, \eta \mid Y^N, U^N) = p(Y^N \mid \theta, \eta, U^N) = \quad (2.35)$$

$$\left(\prod_{k=1}^{N} p(y(k) \mid Y^{k-1}, U^k, \theta)\right) p(y(0) \mid \theta),$$

where $p(y(k)|Y^{k-1}, U^k, \theta)$ is a probability density function, which comes from the noise properties of the stochastic LTI GBM. It is well-known, that in the case of LTI model with Gaussian process and measurement noises, the probability of the predicted output will be also Gaussian. Specially, for the steady state Kalman gain (or known initial state), the probability will be:

$$p(y(k)|Y^N, U^N, \theta, \eta): \quad (2.36)$$

$$N(\hat{y}(k|k-1), \Sigma), (2.37)$$

Finding the arguments that maximize the likelihood function leads to optimization of the problem solution at 320 and is equivalent to minimizing the corresponding negative log-likelihood $$p^* = \arg\max_p L(p \mid Y^N, U^N) = \arg\min_q L(p \mid Y^N, U^N) \quad (2.38)$$

$$L(\cdot) = \frac{N}{2}\log(2\pi) + \frac{N}{2}\log(\det(\Sigma)) + \frac{1}{2}\sum_{k=0}^{N-1} e^T(k)\Sigma^{-1}e(k),$$

$$p = [\theta^T, \eta^T]^T,$$

which is also equivalent to minimizing $$V(p) = \log(\det(\Sigma)) + \operatorname{trace}\left(\frac{1}{N}EE^T\Sigma^{-1}\right). \quad (2.39)$$

Here $E \in R^{n_y \times N}$ denotes a matrix of prediction errors $$E = [e(0|-1) \ldots e(N-1|N-2)]. \quad (2.40)$$

In order to support numerical minimization of (2.39) and hence solve the formulated optimization problem at 320. a gradient (parameter sensitivity) of the cost function must be provided. The partial derivative of the cost function can be computed as follows $$\frac{\partial V(p)}{\partial p_i} = \frac{\partial \overline{V}(p, \Sigma)}{\partial p_i} + \frac{\partial \overline{V}(p, \Sigma)}{\partial \Sigma}\frac{\partial \Sigma}{\partial p_i}. \quad (2.41)$$

In the previous equation $\overline{V}(p, \Sigma)$ is the same function as $V(p)$, but $\Sigma$ is considered to be an independent parameter. Thus the partial derivatives of $\overline{V}(p, \Sigma)$ will be $$\frac{\partial \overline{V}(p, \Sigma)}{\partial p_i} = \frac{2}{N}\operatorname{trace}(E_{p_i}E^T\Sigma^{-1}), \quad (2.42)$$

$$\frac{\partial \overline{V}(p, \Sigma)}{\partial \Sigma} = \Sigma^{-1}(I - \hat{\Sigma}_N \Sigma^{-1}), \text{ where}$$

$$\hat{\Sigma}_N = \frac{1}{N}EE^T, \quad (2.43)$$

$$E_{p_i} = [e_i(0|-1) \; K \; e_i(N-1|N-2)].$$

Partial derivatives of $\Sigma$ with respect to p is given by (2.26).

The sensitivity function (or the gradient) (2.41) can be evaluated when the prediction errors $e(k|k-1)$, their sensitivities $e_i(k|k-1)$ and the sensitivity of the solution to the algebraic Riccati's equation are known. All of this has been already introduced in the previous section.

It is worth mentioning that similar approach can be employed when evaluating the gradient of various PEM criterion functions, e.g. Least Squares Estimation (LSE) and its modifications. Usually it is the prediction error and its sensitivity that are the building blocks for evaluating gradients of the PEM cost functions. Model performance analysis is illustrated at 330 and may utilize model output fit utilizing values of parameters. The parameters may be searched using an iterative (Gauss-Newton) optimization algorithm, i.e. the cost function and all sensitivities are repeatedly evaluated and new updates are computed until a possible local minima is found.

Finally, when the optimal parameters are estimated, the model performance is analyzed. If the performance is not adequate a new model structure and/or new initial estimate of parameters should be provided and the process is repeated.

The proof to (2.42) and (2.43):

With regard to the sensitivity of the MLE, consider the objective function to be parameterized as follows $$\overline{V}(p, \Sigma) = \log(\det(\Sigma)) + \text{trace}\left(\frac{1}{N} E(p) E^T(p) \Sigma^{-1}\right), \quad (3.1)$$

$$p = l \, [\theta^T \quad \eta^T]^T \in R^n.$$

The derivative of the objective function $\overline{V}(p,\Sigma)$ with respect to the vector p and matrix $\Sigma$ will be derived using the following equalities:

$$\text{trace}(AB) = \text{trace}(BA), \text{trace}(A) = \text{trace}(A^T), \quad (3.2)$$

$$\frac{\partial}{\partial y}(\log(\det(X))) = \text{trace}\left(X^{-1}\frac{\partial X}{\partial y}\right), \quad (3.3)$$

$$\frac{\partial}{\partial y} X^{-1} = -X^{-1}\left(\frac{\partial X}{\partial y}\right)X^{-1}, \quad (3.4)$$

$$\frac{\partial}{\partial y}\text{trace}(X) = \text{trace}\left(\frac{\partial X}{\partial y}\right), \frac{\partial}{\partial X}\text{trace}(A^T X) = A, \quad (3.5)$$

$$\frac{\partial}{\partial X}\text{trace}(AX^{-1}B) = -(X^{-1}BAX^{-1})^T, \quad (3.6)$$

A partial derivative of the cost function with respect to a parameter $p_i$ will be (see (3.2) and (3.5))

$$\frac{\partial \overline{V}(p, \Sigma)}{\partial p_i} = \frac{1}{N}\text{trace}\left(\left(\frac{\partial E}{\partial p}\right)E^T\Sigma^{-1} + E\left(\frac{\partial E}{\partial p}\right)^T\Sigma^{-1}\right) = \frac{2}{N}\text{trace}\left(\left(\frac{\partial E}{\partial p}\right)E^T\Sigma^{-1}\right).$$

A partial derivative of the cost function with respect to $\Sigma$ gives (see (3.3), (3.6), and (3.5))

$$\frac{\partial \overline{V}(p, \Sigma)}{\partial \Sigma} = \frac{\partial}{\partial \Sigma}(\log(\det(\Sigma))) + \frac{\partial}{\partial \Sigma}\left(\text{trace}\left(\frac{1}{N} EE^T\Sigma^{-1}\right)\right) \quad (3.7)$$

$$= \text{trace}\left(\Sigma^{-1}\left(\frac{\partial}{\partial \Sigma} \otimes \Sigma\right)\right) + \frac{1}{N}\frac{\partial}{\partial \Sigma}(\text{trace}(E^T\Sigma^{-1}E))$$

-continued $$= \Sigma^{-1} - \Sigma^{-1}\left(\frac{1}{N} EE^T\Sigma^{-1}\right)\Sigma^{-1} = \Sigma^{-1}(I - \hat{\Sigma}_N \Sigma^{-1}).$$

In the last equation $$\hat{\Sigma}_N = \frac{1}{N} EE^T$$

denotes an estimated covariance matrix.

Figure 4:
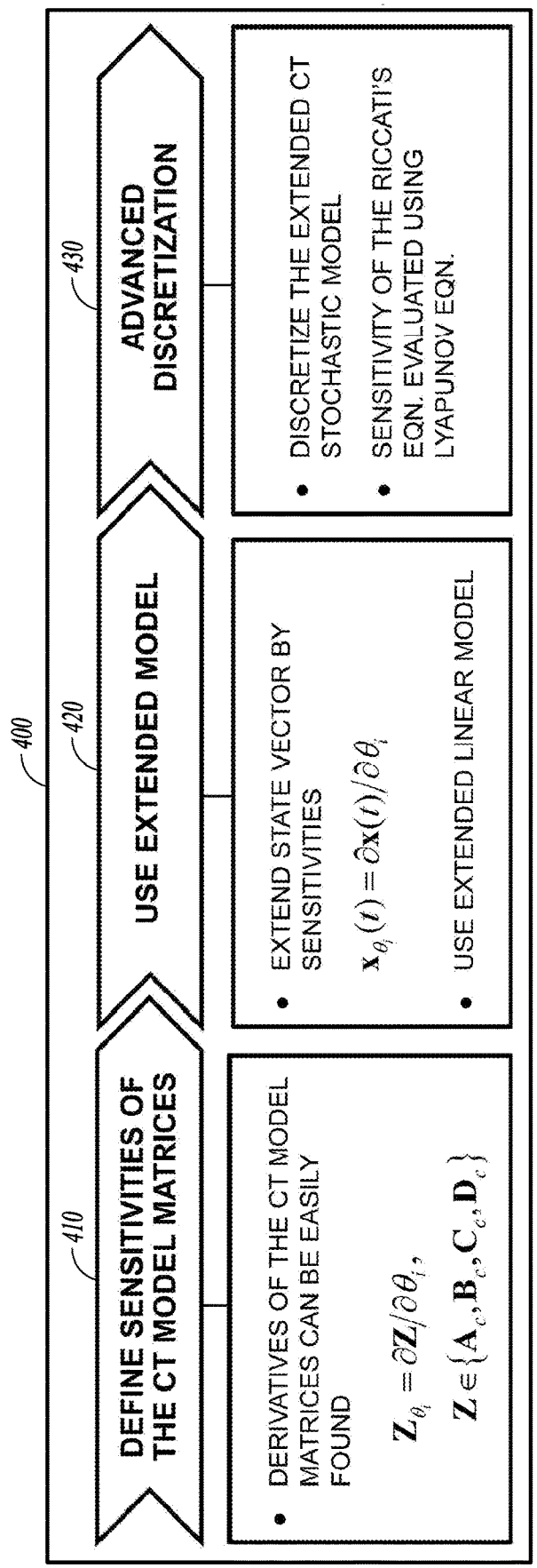
FIG. 4 is a block flow diagram of a method illustrating sensitivity evaluation of a discretized continuous time model according to an example embodiment.

FIG. 4 is a block flow diagram of a method 400 illustrating sensitivity evaluation of a discretized continuous time model. At 410, sensitivities of the continuous time model matrices is performed. Derivatives of the continuous time model matrices can be easily found. At 420, the state vector is extended by the sensitivities and an extended linear model is defined. At 430, the extended continuous time stochastic model is discretized, and the sensitivity of the discrete-time algebraic Riccati's equation is evaluated using the Lyapunov equation.

Figure 5:
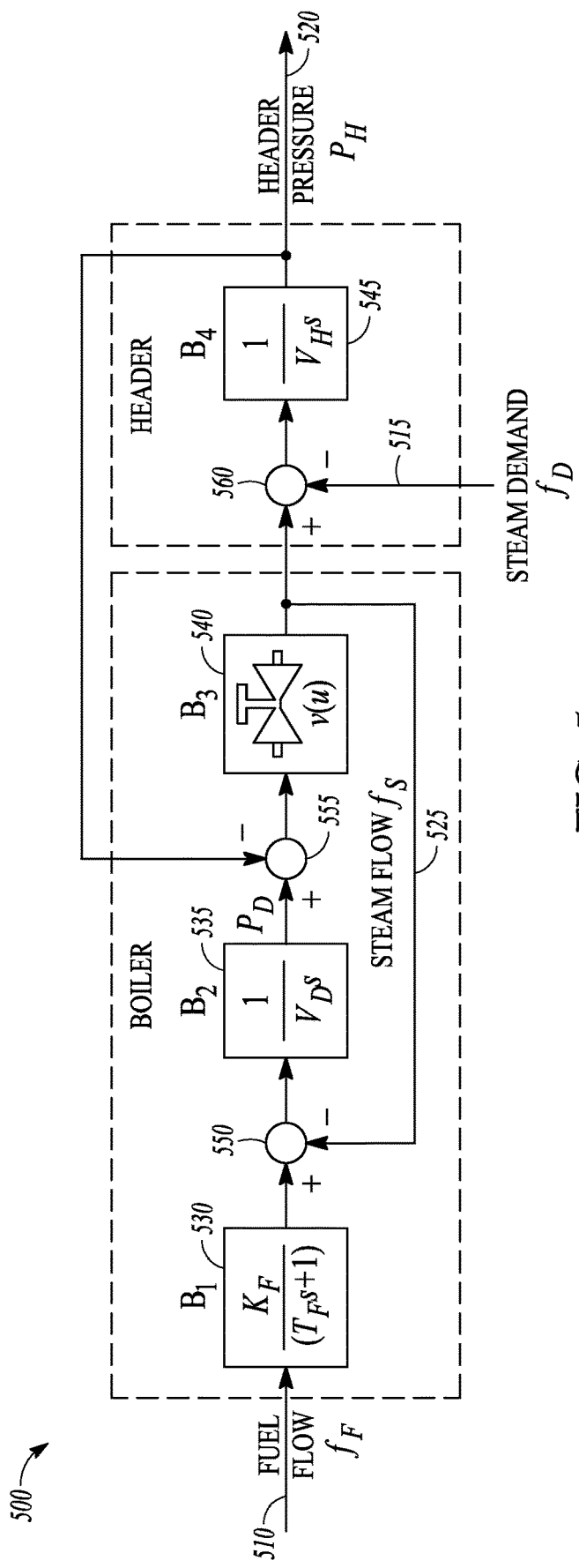
FIG. 5 is a block diagram of an example boiler header model according to an example embodiment.

FIG. 5 is a block diagram of an example boiler header model 500. Model 500 includes two inputs, fuel flow $f_F$ 510 and steam demand $f_D$ at 515. Two outputs include header pressure y1 at 520, and steam flow y2 at 525. There are five physical parameters, KF—fuel to steam gain. TF fuel time constant. VD Drum volume constant, VH header volume constant, and KV valve constant. There are also three stochastic parameters and one constant parameter—steady state steam flow F0 which may be used for valve linearization. A table of inputs, outputs and parameters is shown at 600 in FIG. 6. The model has four modeled interacting model blocks indicated at 530 corresponding to B1, 535 corresponding to B2, 540 corresponding to B3, and 545 corresponding to B4. The block B3 corresponds to a linearized valve model $$y(t) = \frac{1}{2}\frac{K_V^2}{F_0}(p_D(t) - p_H(t)) + \frac{1}{2}F_0, \quad (3.8)$$

where

Various feedback loops are summed at junctions 550, 555, and 560 providing respective inputs. The block-oriented design can be naturally incorporated to the GBM definition, as the model is described in the continuous-time domain. This makes the model easy to modify. Example computation times for 5000 samples of input/output data and a standard laptop processor Intel i5 2.4 GHz may consume approximately 18 seconds using an analytical gradient whereas 13 minutes may be consumed using the numerically evaluated gradient. Note than an equivalent black-box model would have 24 parameters and presumable difficulties with overfitting.

In summary, a continuous time GBM may be derived using first-principles and model splitting. A noise model is included for a good estimate of deterministic parameters. A prediction error method is used to estimate model parameters. To evaluate output predictions, a numerical integration of the stochastic differential equation is solved. In general, this can be very computational expensive. In the case of a linear differential equation and Gaussian process and measurement noises, an exact discretization can be performed which results in a set of difference equations:

$$dx(\tau)=A_c x(\tau)d\tau+B_c u(\tau)d\tau+\tau v_c(\tau)x(k+1)=Ax(k)+Bu(k)+v(k)$$

$$y(t_k)=C_c x(t_k)+D_c u(t_k)+w(t_k) \Longrightarrow y(k)=Cx(k)+Du(k)+w(k)$$

The sensitivity of this exactly discretized model equations is then used to evaluate a gradient of the cost function in a chosen PEM $$\hat{y}_{\theta_i}(k \mid k-1) = \frac{\partial \hat{y}(k \mid k-1)}{\partial \theta_i} \Longrightarrow \nabla_{\theta_c} \frac{\partial}{\partial \theta_c^T} V_{MLE}(\theta_c, U, Y)$$

In the previous section linear time invariant (LTI) gray-box models (GBMs) were considered. Such models typically result from some approximation of more complex non-linear systems and they are valid only locally—close to a given linearization point. In many cases this is sufficient, e.g. when the model is used by a controller to maintain a certain operating point (OP). On the other hand, by using advanced control with multiple manipulated and controlled variables, the optimal OP can be placed in varied positions, which involves more general non-linear models that are valid over an extended region.

Consider two descriptions of a non-linear model of a system. The first one is a static map of steady state inputs to steady state outputs. We will refer to this model to as a "static" or "steady-state" model. The other one is a "dynamic model", which describes also the transient behavior between the steady-states. As expected, the second description should embrace the static description as well.

The static model can be used to place the OP optimally, whereas the dynamic model (a set of models) is employed by the controller to accomplish bringing the system to the operating point (OP). Acquired experimental data is often consist with that assumption. The experimental data is usually composed of various step-tests at different levels (operating points).

Figure 7:
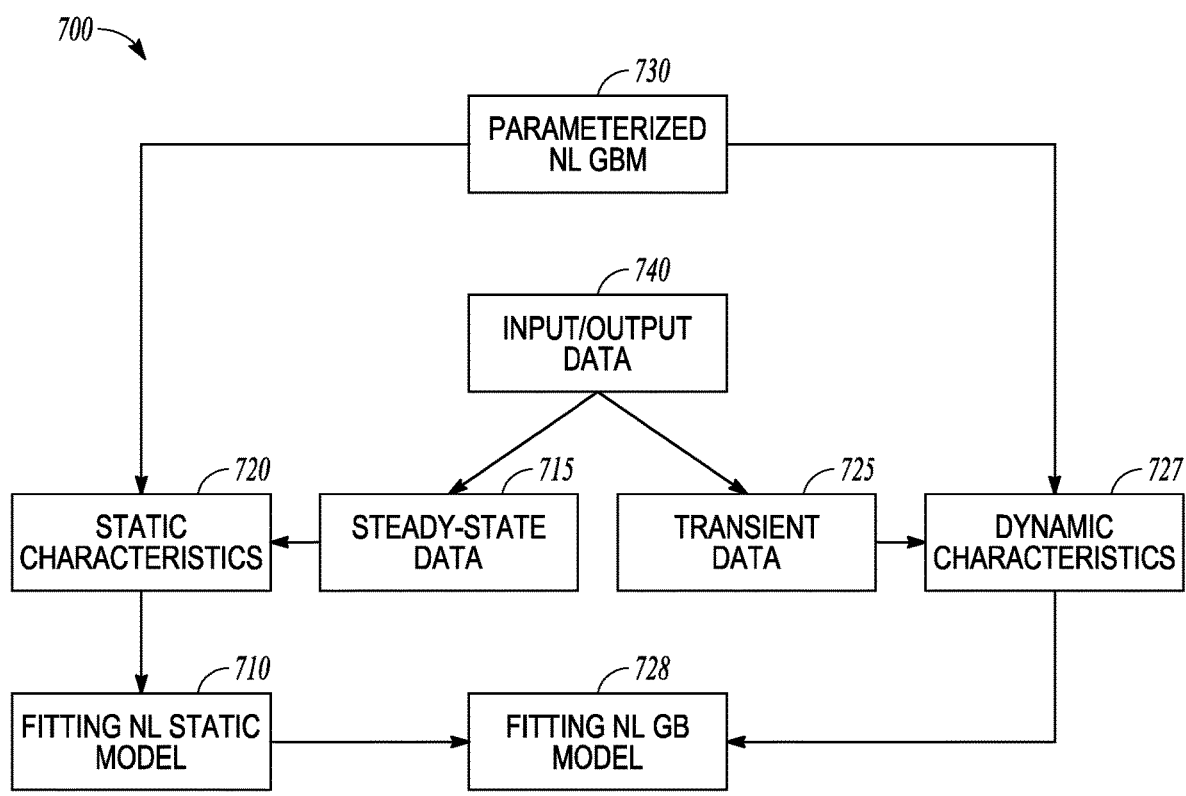
FIG. 7 is a flowchart illustrating nonlinear gray box model identification according to an example embodiment.

The assumptions are used to derive a two-step parameter estimation algorithm illustrated at 700 in FIG. 7. The basic idea is to first estimate a non-linear steady state model 710 using steady-state data 715 and static characteristic 720 to modify a parameterized nonlinear GBM 730. Then the same model 710 is used with the tuned "static" parameters to refine the remaining parameters of the dynamic model using transient data 725 along with dynamic characteristics 727 to fit the nonlinear gray box model as indicated at 728. For the later step an approach designed for LTI GBM is employed by using local linearization of the non-linear model indicated at 1100 in FIG. 11.

Figure 8:
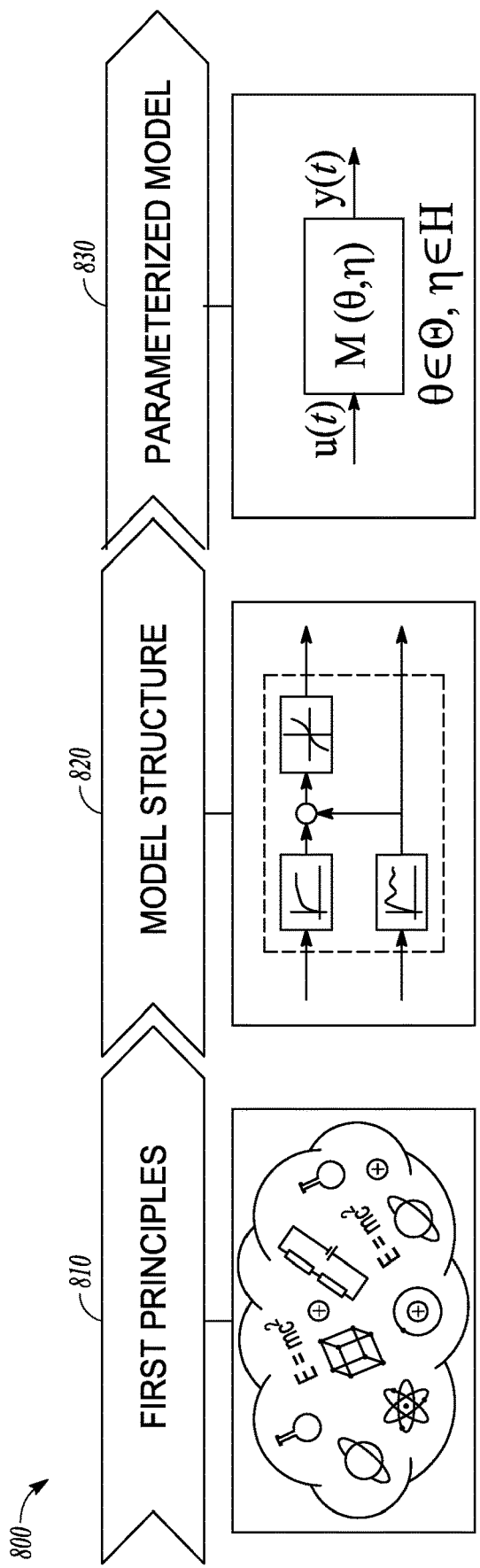
FIG. 8 is a block flow diagram illustrating nonlinear gray box model definition according to an example embodiment.

FIG. 8 illustrates the approach at 800. First principles 810 are applied to derive a model structure at 820, and then the model is parameterized at 830, where: u(t) is a vector of measured inputs, y(t) is a vector of measured outputs, v(t) is a process noise, e(t) is a measurement nois, $\theta \in \Theta$ is a vector of constant deterministic parameters, and $\eta \in H$ is a vector of constant stochastic parameters.

The only difference to the LTI GBM definition is that the resulting model is represented by a set of nonlinear differential equations $$dx(t)=f(x(t),u(t),\theta,t)dt+dv(t)$$

$$y(t_k)=g(x(t_k),u(t_k),\theta,t_k),+e(t_k)$$

For the steady state model estimation, there is no need for numerical integration. The estimation provides enhanced fidelity at low frequency and a physical plausibility of state.

Figure 9:
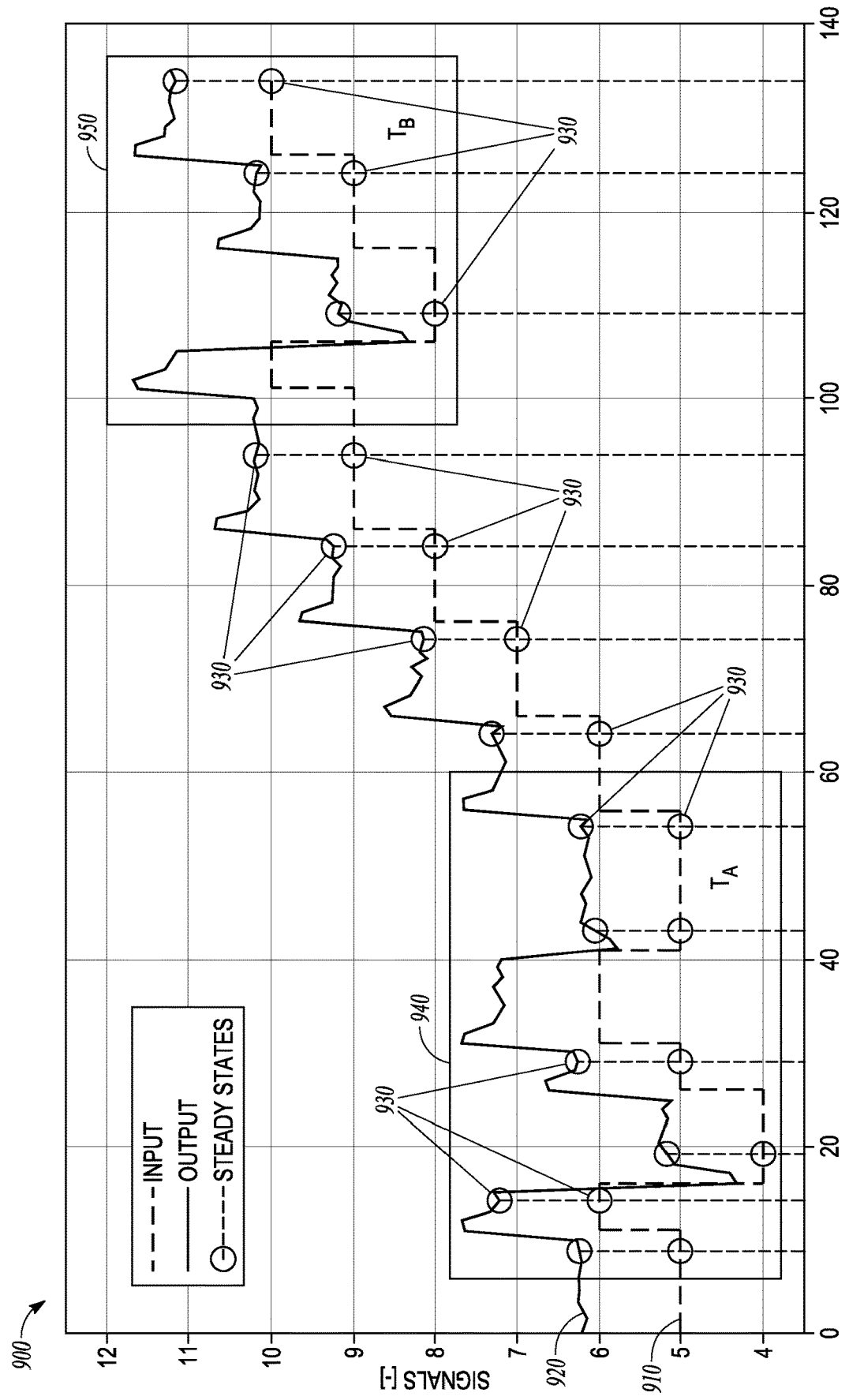
FIG. 9 is a graph illustrating input and output data for a two-step identification of model parameters according to an example embodiment.

In one embodiment, input and output data is analyzed and steady states are extracted. The steady states are considered as new optimization variables which are tuned together with the model parameters such that the steady-state condition is fulfilled and output error minimized. This allows constraint of the model states such that they remain physically feasible. For the dynamical model estimation, pre-estimated parameters from the steady state model estimation may be used. Dynamical parameters are tuned using sub-sequences of experimental data. In one embodiment sequences of input and output data 740 wherein the dynamical modes are excited are determined. An initial guess of the model parameters and their uncertainty from the steady-state model estimation is made. Parameters can be tuned using a brute force ordinary differential equation (ODE) solver plus non-linear Gauss-Newton search. Further improvement uses local linearization and avoids numerical integration by employing the algorithms for linear GBM parameter estimation, as will be described later. Input and output data for the two-step identification of parameters is illustrated in a graph at 900 in FIG. 9. The graph shows a typical course of input signals 910, output signals 920, and steady state points indicated by circles 930 versus discrete time. Two enhanced areas T_A at 940 and T_B at 950 illustrate how transient data may appear.

Figure 10:
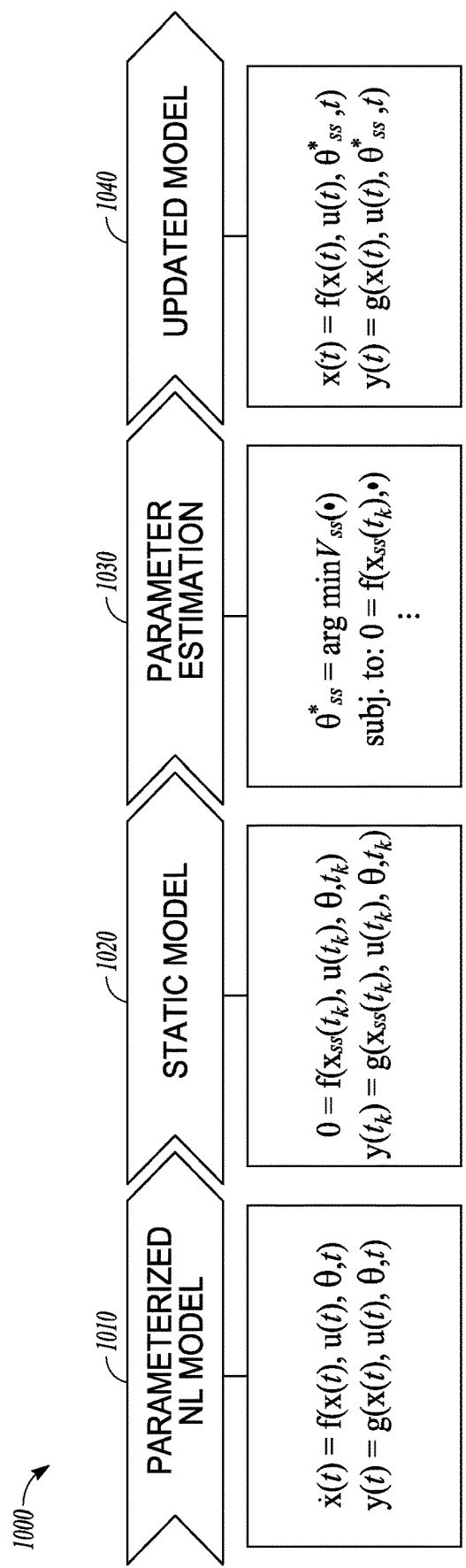
FIG. 10 is a block flow diagram illustrating fitting a nonlinear static model to steady-state data according to an example embodiment.

FIG. 10 illustrates further detail regarding fitting a non-linear static model 710 to steady state data 715 generally at 1000. Given the parameterized model at 1010 as defined by a user, a static model 1020 is built by assuming steady states. An input-output map is then parameterized by the vector of deterministic parameters and steady states, which are defined implicitly by the first equation in the static model 1020. A complete vector of deterministic parameters is considered for the estimation, but only the relevant parameters will be tuned by the steady-state data fitting. Various constraints on parameters and states can be easily introduced during parameter estimation at 1030. The initial parameters of the original model are updated by the newly estimated values to form the updated model at 1040.

Figure 11:
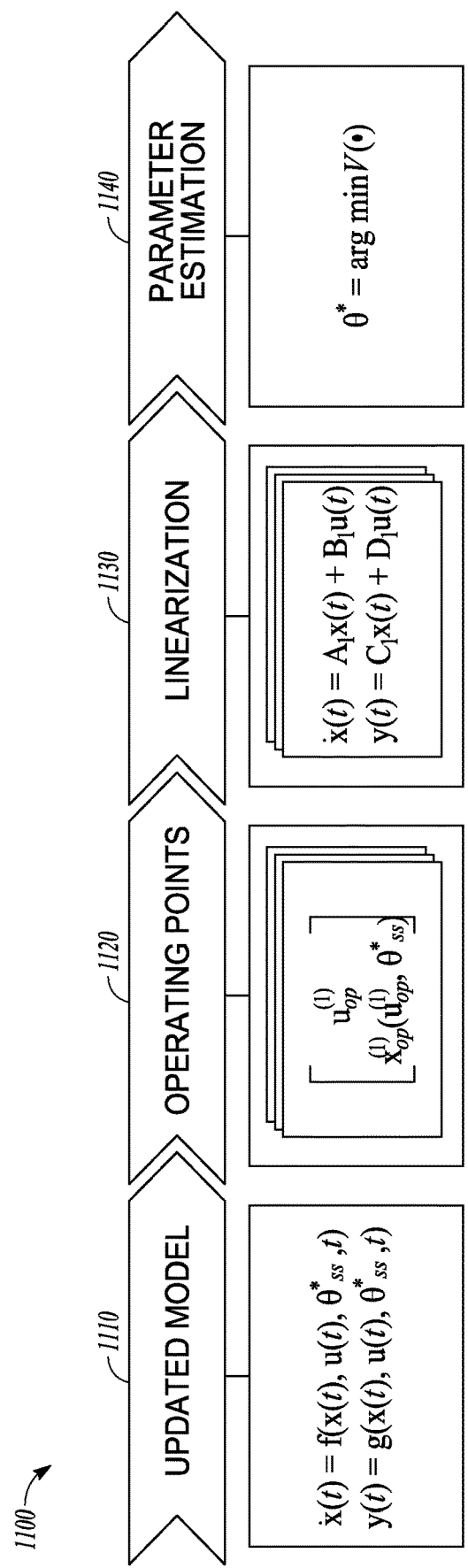
FIG. 11 is a block flow diagram illustrating fitting a nonlinear model to transient data according to an example embodiment.

FIG. 11 illustrates further detail regarding fitting the nonlinear model 728 to the transient data 725 generally at 1100. Given the updated model from 1040, as indicated at 1110, the model is currently fitted to steady-state data and is used as a starting point. From a transient data analysis, a set of operating points are chosen at 1120 such that for a given value of inputs, a corresponding steady-state vector x is evaluated using the tuned static model. A linearized model is computed at 1130 for each operating point. The overall parameter vector is tuned at 1140 using a priori information about the parameters, steady state estimate, and prediction errors of the transient data as predicted by corresponding linearized models. Further Detail of the Steady-state model estimation:

The deterministic non-linear GBM is defined as follows $$\dot{x}(t)=f(x(t),u(t),\theta),$$

$$y(t)=g(x(t),u(t),\theta), \quad (3.9)$$

where $x(t) \in R^{n_x}$ denotes system state, $u(t) \in R^{n_u}$ denotes system input, $y(t) \in R^{n_u}$ denotes system output and $\theta \in \Theta \subset R^{n_\theta}$ denotes constant system parameters. A structure of functions $f(\cdot)$ and $g(\cdot)$, as well as assumptions on the parameters represent the user's prior information.

A steady-state model will be $$0=f(x_{ss},u_{ss},\theta),$$

$$y_{ss}=g(x_{ss},u_{ss},\theta). \quad (3.10)$$

where $x_{ss}$ is a steady-state that corresponds to a steady-state input $u_{ss}$ and output $y_{ss}$. Instead of looking for an explicit solution to $x_{ss}$ the implicit definition is kept. The steady-state data $\{u_{ss}(k), y_{ss}(k)\}$ has to be extracted from the measured data.

The idea is to consider steady-states $x_{ss}(k)$ as free optimization variables; use the first equation in (3.10) as a soft constraint, which handle the steady-state feasibility, and try to minimize the output errors $$e_{ss}(k)=y_{ss}(k)-g(x_{ss}(k),u_{ss}(k),\theta). \tag{3.11}$$

A cost function, which captures this idea $$V_{NL}(\theta, x_{ss}(1), \ldots, x_{ss}(N_{ss})) = \tag{3.12}$$
$$\sum_{k=1}^{N_{ss}} (1-\alpha)\|e_{ss}(k)\|_2^2 + \alpha\|f(x_{ss}(k), u_{ss}(k), p)\|_2^2 + \|\theta - \theta_0\|_P^2.$$

The last term in (3.12) regularizes the parameter estimation—$\theta_0$ is an initial estimate of the parameters and matrix P is used to determine a weight of the initial estimate (typically diagonal matrix). An auxiliary parameter $\alpha \in (0,1)$ is a tuning parameter, which helps with a convergence of the optimization problem.

To evaluate the gradient of the cost function (3.12), the partial derivatives of the model equation must be computed. Assume that functions $f(x,u,\theta)$ and $g(x,u,\theta)$ are continuous and have continuous first-order partial derivatives for given $x_{ss}$, $u_{ss}$, $\theta$; and define $$A(x, u, \theta) = \frac{\partial}{\partial x^T} f(x, u, \theta), \tag{3.13}$$
$$B(x, u, \theta) = \frac{\partial}{\partial u^T} f(x, u, \theta),$$
$$F(x, u, \theta) = \frac{\partial}{\partial \theta^T} f(x, u, \theta),$$
$$C(x, u, \theta) = \frac{\partial}{\partial x^T} g(x, u, \theta),$$
$$D(x, u, \theta) = \frac{\partial}{\partial u^T} g(x, u, \theta),$$
$$G(x, u, \theta) = \frac{\partial}{\partial x^T} g(x, u, \theta).$$

The gradient is then $$\nabla V_{NL} = \left[ \frac{\partial}{\partial \theta^T} V_{NL} \quad \frac{\partial}{\partial x_{ss}^T} V_{NL} \quad \ldots \quad \frac{\partial}{\partial x_{ss}^T(N_{ss})} V_{NL} \right], \tag{3.14}$$

where $$\frac{\partial}{\partial \theta^T} V_{NL} = 2 \sum_{k=1}^{N_{ss}} [(\alpha-1)e_{ss}^T(k)G(k) + \alpha f(k)^T F(k)] + 2(\theta - \theta_0)^T P, \tag{3.15}$$
$$\frac{\partial}{\partial x_{ss}^T(k)} V_{NL} = 2(\alpha-1)e_{ss}^T(k)C(k) + 2\alpha f(k)^T A(k).$$

Note that a simplified notation $X(k)=X(x_{ss}(k), u_{ss}(k),\theta)$ has been used for $X \in \{A,B,C,D,G,F\}$.

Similarly, the second-order derivatives can be also evaluated and used for construction of the Hessian matrix. These derivatives will be further reused in the second step—estimation of dynamic parameters using transient data.

A substantial amount of information lies in known constraints. Constraints on model parameters can be derived from the first-principle knowledge and data inspection. These assumptions can be easily added as linear constraints. Typically $$\theta_{min} \leq \theta \leq \theta_{max},$$
$$\Omega(u_{ss}(k),k)x_{ss}(k) \leq \omega(u_{ss}(k),k). \tag{3.16}$$

Finally, the user has to select an initial estimate of (feasible) parameters and run the optimization $$\theta_{ss}^* = \arg\min_{\theta, x_{ss}(1), \ldots, x_{ss}(N_{ss})} V_{NL}(\theta, x_{ss}(1), \ldots, x_{ss}(N_{ss})) \tag{3.17}$$
$$subj. \text{ to } \theta_{min} \leq \theta \leq \theta_{max}$$
$$\Omega(u_{ss}(k), k)x_{ss}(k) \leq \omega(u_{ss}(k), k)$$

The optimal value of steady-state estimate $\theta_{ss}^*$ and the corresponding Hessian matrix $H^*$ are used as an initial point for the next step, estimation of non-linear dynamical model.

Further Detail of the Non-Linear Dynamical Model Estimation:

Once the steady-state model has been estimated, the next step is to tune the remaining parameters using measured transient responses of the system. Some prediction error method is again employed to find an optimal value of parameters of non-linear model.

In order to evaluate prediction errors of the non-linear model, some numerical integration method are typically employed to solve the appropriate differential equation (3.9). Furthermore, this must be solved for each step of the iterative optimization algorithm, which searches for the optimal parameters. This makes the approach usable only for small data sets and simple models (where the corresponding differential equation can be easily solved).

Using the fact, that experimental transient data is usually centered on some given operating point, a local approximation can be sufficient to capture the model behavior. The linearized model will have a form $$\dot{x}(t)=Ax(t)+Bu(t)+b,$$
$$y(t)=Cx(t)+Du(t)+d, \tag{3.18}$$

and the matrices A, B, C, D and vectors b, d will be functions of the operating point $x_{op}$, $u_{op}$ and the parameter vector $\theta$ $$A=A(x_{op},u_{op},\theta), \quad C=C(x_{op},u_{op},\theta),$$
$$B=B(x_{op},u_{op},\theta), \quad D=D(x_{op},u_{op},\theta),$$
$$b=f(x_{op},u_{op},\theta)-Ax_{op}-Bu_{op}, \quad d=g(x_{op},u_{op},\theta)-Cx_{op}-Du_{op}. \tag{3.19}$$

Note, that by extending the input vector $u(t) \to [u^T(t)1]^T$, the above "affine" representation may be translated to a standard linear representation (2.1). System matrices are functions not only of the deterministic parameters $\theta$, but also of the operating point.

Regarding the character of the transient data, we can assume that $\{x_{op}, u_{op}\}$ is a steady-state pair; i.e. $x_{op}$ satisfies the equation $0=f(x_{op},u_{op},\theta)$, $u_{op}$ is given for every operating point; e.g. as a mean value of the input sub-sequence.

The triple $\{x_{op}, u_{op}, \theta\}$ is linked and thus, the number of parameters can be reduced by up to $m \times (n_x + n_u)$ variables. Here m is a number of operating points (transient data sets) considered.

To apply the approach derived for the LTI GBM in the Section 2, partial derivatives of matrices (3.19) has to be defined. This is not a difficult task if the second order derivatives of functions f(•) and g(•) are known.

Let $p \in \{\theta_1, \ldots, \theta_{n_\theta}\}$ be a single parameter then for a total differential we have $$A_p = \frac{\partial}{\partial p} A + \sum_{i=1}^{n_x} \frac{\partial A}{\partial x_i} \frac{dx_i}{dp}, \quad (3.20)$$

$$B_p = \frac{\partial}{\partial p} B + \sum_{i=1}^{n_x} \frac{\partial B}{\partial x_i} \frac{dx_i}{dp},$$

$$b_p = F - A_p x_{op} - B_p u_{op},$$

$$C_p = \frac{\partial}{\partial p} C + \sum_{i=1}^{n_x} \frac{\partial C}{\partial x_i} \frac{dx_i}{dp},$$

$$D_p = \frac{\partial}{\partial p} D + \sum_{i=1}^{n_x} \frac{\partial D}{\partial x_i} \frac{dx_i}{dp},$$

$$d_p = G - C_p x_{op} - D_p u_{op},$$

where $$\frac{\partial}{\partial p} A(x_{op}, u_{op}, \theta) = \frac{\partial^2}{\partial x^T \partial p} f(x, u, \theta) \Big|_{\substack{x=x_{op} \\ u=u_{op} \\ \theta}}, \quad (3.21)$$

$$\frac{\partial}{\partial p} C(x_{op}, u_{op}, \theta) = \frac{\partial^2}{\partial x^T \partial p} g(x, u, \theta) \Big|_{\substack{x=x_{op} \\ u=u_{op} \\ \theta}},$$

$$\frac{\partial}{\partial p} B(x_{op}, u_{op}, \theta) = \frac{\partial^2}{\partial u^T \partial p} f(x, u, \theta) \Big|_{\substack{x=x_{op} \\ u=u_{op} \\ \theta}},$$

$$\frac{\partial}{\partial p} D(x_{op}, u_{op}, \theta) = \frac{\partial^2}{\partial u^T \partial p} g(x, u, \theta) \Big|_{\substack{x=x_{op} \\ u=u_{op} \\ \theta}},$$

$$\frac{\partial}{\partial p} b(x_{op}, u_{op}, \theta) = F - A_p x_{op} - B_p u_{op},$$

$$\frac{\partial}{\partial p} d(x_{op}, u_{op}, \theta) = G - C_p x_{op} - D_p u_{op}.$$

By using the relation for the steady-state operating point $0 = f(x_{op}, u_{op}, \theta)$, we obtain for $$\frac{dx_{op}}{d\theta^T}$$

$$0 = \frac{df}{d\theta^T} = \frac{\partial f}{\partial x^T} \frac{dx}{d\theta^T} + \frac{df}{d\theta^T} = A \frac{dx}{d\theta^T} + F \quad (3.22)$$

$$\Rightarrow \frac{dx}{d\theta^T} = -A \backslash F.$$

Now all the information is available for estimating parameters of the linearized GBM by the above mentioned algorithm, using for example the MLE, described above. The point is that parameters, to be estimated, are actually the parameters of the corresponding non-linear model (at least a part of its parameters). Based on the data available, several operating points may be selected and utilized for tuning the "dynamical" parameters of the non-linear GBM. Note that the steady-state model is considered to be already tuned as described in the described above.

In one embodiment, a two-step parameter estimation may be performed. First, a non-linear static map is estimated from the steady-state data as described above. Next, a set of operating points is identified using steady-state conditions for each level. For a chosen value of $u_{op}$ and using the steady-state condition $0 = f(x_{op}, u_{op}, \hat{\theta}_{ss})$, where $\hat{\theta}_{ss}$ is the estimated steady-state vector of parameters, we have $\hat{x}_{op} = x_{op}(\hat{\theta}, u_{op})$. Substituting this into the (3.19) the linearized model is obtained $$A_c = A_c(\hat{x}_{op}, u_{op}, \theta), \ldots, D_c = D_c(\hat{x}_{op}, u_{op}, \theta). \quad (3.23)$$

In further detail, let $V_{LN}^{(i)}(\theta, \eta)$ be a cost function for LTI GBM parameter estimation (e.g. MLE (2.39)) that corresponds to transient data set #i. Here, $\eta$ is a vector of "stochastic" parameters as defined above. An example of overall cost function for estimating "dynamical" parameters of the non-linear GBM is $$v(\theta, \eta) = V_{LTI}^{(1)}(\theta, \eta) + \ldots + V_{LTI}^{(m)}(\theta, \eta) + \gamma \|\theta - \theta_{ss}^*\|_{H_{ss}}^2. \quad (3.24)$$

The last term in the equation (3.24) assures that the information from the non-linear steady-state model estimation is preserved ($\theta_{ss}^*$, $H_{ss}$ are the optimal parameter estimate and its Hessian from the steady-state model parameter estimation, $\gamma$ is a weighting factor).

A summary of a practical application is now provided. In one embodiment a user defines a non-linear gray-box model as follows:

$$dx(\tau) = f(x(\tau), u(\tau), \theta) + \tau v(\tau)$$

$$y(t_k) = g(x(t_k), u(t_k), \theta) + e(t_k) \quad (3.25)$$

First and second order partial derivatives may be solved using a symbolic solver or by using pre-defined model blocks that are simply interconnected by a user as illustrated in FIG. 5 using a suitable graphical user interface. The partial derivatives may include:

$$\frac{\partial}{\partial x^T} f(\cdot), \frac{\partial}{\partial u^T} f(\cdot), \frac{\partial}{\partial \theta^T} f(\cdot) \quad \frac{\partial^2}{\partial \theta_i \partial x_j} f(\cdot), \frac{\partial^2}{\partial \theta_i \partial u_j} f(\cdot), \frac{\partial^2}{\partial \theta^2} f(\cdot)$$

$$\frac{\partial}{\partial x^T} g(\cdot), \frac{\partial}{\partial u^T} g(\cdot), \frac{\partial}{\partial \theta^T} g(\cdot) \quad \frac{\partial^2}{\partial \theta_i \partial x_j} g(\cdot), \frac{\partial^2}{\partial \theta_i \partial u_j} g(\cdot), \frac{\partial^2}{\partial \theta^2} g(\cdot)$$

Steady-state data and transient data may then be provided to a programmed computer for formulation of the parameter estimation optimization problem, including steady-state parameter estimation supported by analytical gradient and Hessian, and dynamical parameter estimation supported by fast exact discretization and analytical gradient.

Conclusion:

We have shown that, assuming that we have provided the first and second-order derivatives of the system equations (3.9), the parameter estimation task can be well-formulated as follows 1. The non-linear steady state model parameters are estimated using an iterative optimization method, which is supported by an analytical gradient and Hessian. Furthermore, state constrains can be easily imposed, in this phase, which helps to achieve a physically feasible estimate.
2. Considering a specific shape of the experimental data (several step-tests at different levels/operating points), which are typical in process control etc. And assuming that the model behavior can be well approximated by an LTI model, which is sufficiently valid for the each subsequence. The nonlinear model parameters can be easily estimated using a set of linearized models. Moreover, these models are consistent with the developed framework for the LTI GBM parameter estimation, described above.

A coherent algorithm for the parameter estimation of the LTI GBM makes the hard non-linear optimization task numerically tractable and computationally effective. In various embodiments, the complexity of the parameter optimization is performed by a machine, making the model identification as user-friendly as possible.

Figure 12:
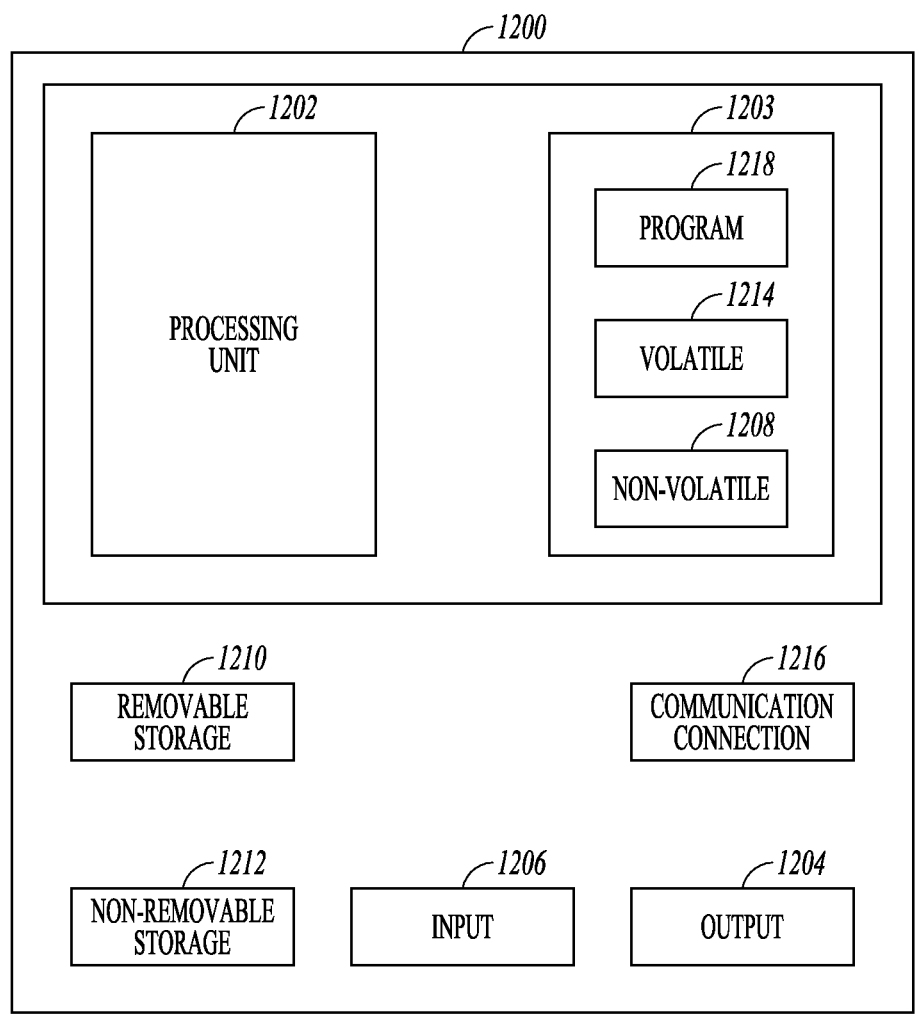
FIG. 12 is a block diagram of a computer system for implementing the controller and performing modelling according to example embodiments.

FIG. 12 is a block schematic diagram of a computer system 1200 to implement methods used in model estimation and to implement advanced controllers according to example embodiments. All components need not be used in various embodiments. One example computing device in the form of a computer 1200, may include a processing unit 1202, memory 1203, removable storage 1210, and non-removable storage 1212. Although the example computing device is illustrated and described as computer 1200, the computing device may be in different forms in different embodiments. For example, the computing device may instead be a smartphone, a tablet, smartwatch, or other computing device including the same or similar elements as illustrated and described with regard to FIG. 12. Devices such as smartphones, tablets, and smartwatches are generally collectively referred to as mobile devices. Further, although the various data storage elements are illustrated as part of the computer 1200, the storage may also or alternatively include cloud-based storage accessible via a network, such as the Internet.

Memory 1203 may include volatile memory 1214 and non-volatile memory 1208. Computer 1200 may include—or have access to a computing environment that includes—a variety of computer-readable media, such as volatile memory 1214 and non-volatile memory 1208, removable storage 1210 and non-removable storage 1212. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

Computer 1200 may include or have access to a computing environment that includes input 1206, output 1204, and a communication connection 1216. Output 1204 may include a display device, such as a touchscreen, that also may serve as an input device. The input 1206 may include one or more of a touchscreen, touchpad, mouse, keyboard, camera, one or more device-specific buttons, one or more sensors integrated within or coupled via wired or wireless data connections to the computer 1200, and other input devices. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN), cellular, WiFi, Bluetooth, or other networks.

Computer-readable instructions stored on a computer-readable medium are executable by the processing unit 1202 of the computer 1200. A hard drive, CD-ROM, and RAM are some examples of articles including a non-transitory computer-readable medium such as a storage device. The terms computer-readable medium and storage device do not include carrier waves. For example, a computer program 1218 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 1200 to provide generic access controls in a COM based computer network system having multiple users and servers.

EXAMPLES

1. A method comprising:
using first principles and engineering knowledge to define a continuous time nonlinear gray-box model of a system performing a process;
defining a numerically tractable optimization problem for parameter estimation of the nonlinear gray-box model;
tuning a vector of parameters of a static model of the nonlinear gray-box model; and
extending the vector of parameters of the static model to a dynamic model by fitting measured transient data from the process.

2. The method of example 1 wherein fitting measured transient data uses a local linear approximation of the non-linear gray-box model, and thus avoiding computationally expensive numerical integration.

3. The method of any of examples 1-2 and further comprising providing analytical sensitivity to the optimizing parameters.

4. The method of example 3 wherein sensitivity is provided as a gradient of a cost function, wherein the gradient is computed using prediction errors and their sensitivities to the parameters.

5. The method of example 4 and further comprising evaluating the computation of the prediction errors and their sensitivities of locally linearized gray-box models corresponding to local linearized models of the nonlinearized gray-box model using an extended discrete-time linear stochastic model.

6. The method of example 5 wherein the locally linearized gray-box models are defined by a set of first order stochastic differential equations;

$$dx(t)=A(\theta)x(t)dt+B(\theta)u(t)dt+dv(t),$$

$$y(t_k)=C(\theta)x(t_k)+D(\theta)u(t_k)+w(t_k),$$

where $x(t) \in R^{n_x}$ denotes system state, $u(t) \in R^{n_x}$ denotes system measured input, $y(t_k) \in R^{n_y}$ denotes system measured output. $\theta \in R^{n_p}$ denotes constant system parameters, $v(t) \in R^{n_y}$ is an $n_x$—dimensional Wiener process with $dv(t) \sim N(0, Q_c dt)$, $w(t_k) \in R^{n_y}$ is an $n_y$—dimensional white noise process with $w(t_k) \sim N(0, R)$, and A, B, C, and D are matrices of a deterministic description of the model.

7. The method of example 5 and further comprising computing an extended discrete-time linear stochastic model using the continuous-time stochastic gray-box model.

8. The method of example 7 wherein discretizing the extended continuous time stochastic linear model to create a discrete time stochastic model parameterized by the same vector of parameters while maintaining the sensitivities includes:
generating discrete-time matrices; and
solving the discrete-time matrices using an augmented matrix exponential to obtain the discrete time stochastic model.

9. The method of example 8 wherein discretizing the extended continuous time stochastic linear model to create a discrete time stochastic model with the optimized vector of parameters while maintaining the sensitivities further comprises:
parameterizing the discrete time stochastic model using the continuous time model parameters;
utilizing a prediction error method with the continuous time linear gray-box model and measured data to estimate unknown parameters.

10. The method of example 9 wherein the prediction error is determined by solving Ricati's equation to compute the prediction error using the optimized vector of parameters by:
defining an initial estimate of all the unknown parameters that define a vector of deterministic parameters θ, a discretized process noise matrix Q, measurement noise matrix R, and initial state of the model x;
selecting a prediction error cost function; and
iteratively looking for an optimal value of the unknown parameters that minimizes the prediction error cost function.

11. The method of any of examples 1-10 and further comprising evaluating the sensitivity of the prediction errors to the model optimized parameters via a solution to a specific Lyapunov's equation.

12. The method of any of examples 1-11 and further comprising:
providing the gray-box model with optimized parameters to the advanced controller; and
controlling the system using the optimized gray-box model.

13. The method of any of examples 1-12 wherein discretizing the extended continuous time stochastic model is performed using Riccati's equation and a Lyapunov equation is used to evaluate the sensitivity of the Riccati's equation.

14. An advanced controller having a parameterized model for controlling a system to control a process comprising:
a processor; and
a storage device having code and data to define a gray-box model of the system and corresponding parameters for the gray-box model, wherein the parameters are determined in accordance with a method at least partially performed by a programmed computer, the method comprising:
defining a numerically tractable optimization problem for parameter estimation of a general nonlinear gray-box model;
tuning parameters of a static model of the nonlinear gray-box model;
extending the parameters of the static model to a dynamic model by fitting measured transient data from the process.

15. The advanced controller of example 14 wherein the gray-box model is defined by a set of first order differential equations:

$$\dot{x}(t)=f(x(t),u(t),\theta,t)$$

$$y(t)=g(x(t),u(t),\theta,t)$$

where $x(t) \in R^{n_x}$ denotes system state, $u(t) \in R^{n_x}$ denotes system measured input, $y(t) \in R^{n_y}$ denotes system measured output, $\theta \in R^{n_p}$ denotes constant system parameters, and functions $f(\cdot)$ and $g(\cdot)$ represents the nonlinear gray-box model.

16. The advanced controller of any of examples 14-15 wherein the nonlinear gray-box model 15 is used to control the process; primarily to compute optimal set-point of the underlying closed-loop controller.

17. The advanced controller of any of examples 14-16 wherein the nonlinear gray-box model 15 is used to compute an optimal set-point and initialize a locally linearized gray-box model, which is used by a closed-loop model predictive controller to perform optimal control.

$$\dot{x}(t)=A(\theta)x(t)+B(\theta)u(t),$$

$$y(t)=C(\theta)x(t)+D(\theta)u(t),$$

where $x(t) \in R^{n_x}$ denotes system state, $u(t) \in R^{n_x}$ denotes system measured input, $y(t) \in R^{n_y}$ denotes system measured output, $\theta \in R^{n_p}$ denotes constant system parameters, and A, B, C, and D are matrices of a deterministic description of the model.

18. The advanced controller of any of examples 14-17 wherein the method at least partially performed by a programmed computer further comprises defining a noise model including process and measurement noise in the continuous time domain utilizing stochastic parameters.

19. The advanced controller of example 18 wherein the linear stochastic model is defined as:

$$dx(t)=A(\theta)x(t)dt+B(\theta)u(t)dt+dv(t),$$

$$y(t_k)=C(\theta)x(t_k)+D(\theta)u(t_k)+w(t_k),$$

where $x(t) \in R^{n_z}$ denotes system state, $u(t) \in R^{n_x}$ denotes system measured input, $y(t_k) \in R^{n_y}$ denotes system measured output, $\theta \in R^{n_p}$ denotes constant system parameters, $v(t) \in R^{n_x}$ is an $n_x$—dimensional Wiener process with $dv(t) \sim N(0, Q_c dt)$, $w(t_k) \in R^{n_y}$ is an $n_y$—dimensional white noise process with $w(t_k) \sim N(0,R)$, and A, B, C, and D are matrices of a deterministic description of the model.

20. The advanced controller of any of examples 14-19 wherein discretizing the continuous time stochastic linear model to create a discrete time stochastic model with optimized parameters while maintaining the sensitivities includes:
generating discrete-time matrices; and
solving the discrete-time matrices using an augmented matrix exponential to obtain the discrete time stochastic model.

21. A method comprising:
estimating a non-linear steady state model representative of a system performing a process using steady-state data, the model providing tuned static parameters for an advanced controller to control the system; and
using the non-linear steady state model with the tuned static parameters to tune dynamic gray-box model parameters using sub-sequences of transient experimental data.

22. The method of example 21 and further comprising:
providing tuned gray-box parameters to the advanced controller; and
controlling the system using the provided gray-box parameters.

23. An advanced controller having a parameterized model for controlling a system to perform a process comprising:
a processor; and
a storage device having code and data to define a dynamic gray-box model of the system and corresponding dynamic gray-box parameters for the gray-box model, wherein the parameters are determined in accordance with a method at least partially performed by a programmed computer, the method comprising:
estimating a non-linear steady state model representative of a system performing a process using steady-state data, the model providing tuned static parameters for an advanced controller to control the system; and
using the non-linear steady state model with the tuned static parameters to provide dynamic gray-box model parameters using sub-sequences of transient experimental data.

24. A method comprising:
    performing a steady-state model estimation to obtain a vector of steady state parameters for a non-linear model representative of a system controlled by an advanced controller to perform a process; and
    tuning the vector of steady-state parameters by a using local approximation for estimation of non-linear model parameters at different operating levels of the system to obtain local linear model vectors of gray-box parameters for the advanced controller.

25. The method of example 24 and further comprising:
    providing the tuned gray-box parameters to the advanced controller; and
    controlling the system using the provided gray-box parameters.

26. An advanced controller having a parameterized model for controlling a system to perform a process comprising:
    a processor; and
    a storage device having code and data to define a dynamic gray-box model of the system and corresponding dynamic gray-box parameters for the gray-box model wherein the parameters are determined in accordance with a method at least partially performed by a programmed computer, the method comprising:
    performing a steady-state model estimation to obtain a vector of steady state parameters for a non-linear model representative of a system controlled by the advanced controller; and
    tuning the vector of steady-state parameters by a using local approximation for estimation of non-linear model parameters at different operating levels of the system to obtain local linear model vectors of gray-box parameters for the advanced controller.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:
1. A method comprising:
    using first principles and engineering knowledge to define a continuous time nonlinear gray-box model of a system performing a process and to determine a linear time-invariant (LTI) gray-box model deterministic structure, wherein the first principles comprise assumptions from laws of physics of the system and the engineering knowledge comprises empirical laws discovered by observation of the system;
    defining a numerically tractable optimization problem for parameter estimation of the nonlinear gray-box model, wherein the numerically tractable optimization problem for parameter estimation comprises a problem that can be defined by a system of equations;
    tuning a vector of parameters for optimization of a static model of the nonlinear gray-box model;
    extending the vector of parameters of the static model to a dynamic model by fitting measured transient data from the process;
    providing the gray-box model with optimized parameters to a controller;
    controlling the system using the optimized gray-box model;
    wherein fitting measured transient data uses a local linear approximation of the non-linear gray-box model, and thus avoiding computationally expensive numerical integration, and wherein the method further comprises providing analytical sensitivity to the optimized parameters wherein the analytical sensitivity is provided as a gradient of a cost function, wherein the gradient is computed using prediction errors and the analytical sensitivity to the optimized parameters, wherein the analytical sensitivity comprises a measure of how output of the model of the system changes with changes in the optimized parameters, and wherein the prediction errors and the analytical sensitivity comprise a deviation from a predicted outcome and a change in an input or an output of the optimized gray-box model;
    and further comprising evaluating the computation of the prediction errors and the analytical sensitivity of locally linearized gray-box models corresponding to local linearized models of the nonlinearized gray-box model using an extended discrete-time linear stochastic model, wherein the locally linearized gray-box models are defined by a set of first order stochastic differential equations;

$dx(t)=A(\theta)x(t)dt+B(\theta)u(t)dt+dv(t),$ $y(t_k)=C(\theta)x(t_k)+D(\theta)u(t_k)+w(t_k),$ where $x(t) \in R^{n_x}$ denotes system state, $u(t) \in R^{n_x}$ denotes system measured input, $y(t_k) \in R^{n_y}$ denotes system measured output, $\theta \in R^{n_p}$ denotes constant system parameters, $v(t) \in R^{n_x}$ is an $n_x$—dimensional Wiener process with $dv(t) \sim N(0, Q_c dt)$, $w(t_k) \in R^{n_y}$ is an $n_y$—dimensional white noise process with $w(t_k) \sim N(0, R)$, and A, B, C, and D are matrices of a deterministic description of the model;
    and further comprising computing a discrete-time linear stochastic model using the continuous-time stochastic gray-box model wherein discretizing the extended continuous time stochastic linear model to create the discrete-time linear stochastic model parameterized by the vector of parameters while maintaining sensitivities of the discrete-time linear stochastic model includes:
    generating discrete-time matrices; and
    solving the discrete-time matrices using a matrix exponential to obtain the discrete-time linear stochastic model;
    wherein discretizing the continuous time stochastic linear model to create the discrete-time linear stochastic model with the optimized vector of parameters while maintaining an extent to which a variable affects the discrete-time linear stochastic model further comprises:
    parameterizing the discrete time stochastic model using the continuous time model parameters;
    utilizing a prediction error method with measured data and the continuous time linear gray-box model to estimate unknown parameters;
    wherein the prediction error is determined by solving Ricati's equation to compute the prediction error using the optimized vector of parameters by:
    defining an initial estimate of all the unknown parameters that define a vector of deterministic parameters $\theta$, a discretized process noise matrix Q, measurement noise matrix R, and initial state of the model x;
    selecting a prediction error cost function; and
    iteratively looking for an optimal value of the unknown parameters that minimizes the prediction error cost function.

2. A controller having a parameterized model for controlling a system to control a process comprising:
   a processor; and
   a storage device having code and data to define a continuous time nonlinear gray-box model of the system and corresponding parameters for the continuous time nonlinear gray-box model, wherein the corresponding parameters are determined in accordance with a method at least partially performed by a programmed computer, the method comprising:
   using first principles and engineering knowledge to define the continuous time nonlinear gray-box model of the system performing a process and to determine a linear time-invariant (LTI) gray-box model deterministic structure, wherein the first principles comprise assumptions from laws of physics of the system and the engineering knowledge comprises empirical laws discovered by observation of the system;
   defining a numerically tractable optimization problem for parameter estimation of the continuous time nonlinear gray-box model, wherein the numerically tractable optimization problem for parameter estimation comprises a problem that can be defined by a system of equations;
   tuning parameters for optimization of a static model of the continuous time nonlinear gray-box model;
   extending the parameters of the static model to a dynamic model by fitting measured transient data from the process;
   providing the continuous time non-linear gray-box model to the controller; and
   controlling the system using the optimized the static model of the continuous time nonlinear gray-box model;
   wherein fitting measured transient data uses a local linear approximation of the continuous time nonlinear gray-box model, and thus avoiding computationally expensive numerical integration, and wherein the method further comprises providing analytical sensitivity to the optimized parameters wherein the analytical sensitivity is provided as a gradient of a cost function, wherein the gradient is computed using prediction errors and the analytical sensitivity to the optimized parameters, wherein the analytical sensitivity comprises a measure of how output of the model of the system changes with changes in the optimized parameters, and wherein the prediction errors and the analytical sensitivity comprise a deviation from a predicted outcome and a change in an input or an output of the optimized continuous time nonlinear gray-box model;
   and further comprising evaluating the computation of the prediction errors and the analytical sensitivity of locally linearized gray-box models corresponding to local linearized models of the continuous time nonlinear gray-box model using an extended discrete-time linear stochastic model, wherein the locally linearized gay-box models are defined by a set of first order stochastic differential equations;

$dx(t)=A(\theta)x(t)dt+B(\theta)u(t)dt+dv(t),$ $y(t_k)=C(\theta)x(t_k)+D(\theta)u(t_k)+w(t_k),$ where $x(t) \in R^{n_x}$ denotes system state, $u(t) R^{n_x}$ denotes system measured input, $y(t_k) \in R^{n_y}$ —denotes system measured output, $\theta \in R^{n_p}$ denotes constant system parameters, $v(t) \in R^{n_x}$ is an $n_x$ —dimensional Wiener process with $dv(t) \sim N(0,Q_c dt), w(t_k) \in R^{n_y}$ is an $n_y$ —dimensional white noise process with $w(t_k) \sim N(0,R)$, and A, B, C, and D are matrices of a deterministic description of the model;
   and further comprising computing a discrete-time linear stochastic model using the continuous-time stochastic ray-box model wherein discretizing the extended continuous time stochastic linear model to create the discrete-time linear stochastic model parameterized by the parameters while maintaining sensitivities of the discrete-time linear stochastic model includes:
   generating discrete-time matrices; and
   solving the discrete-time matrices using a matrix exponential to obtain the discrete-time linear stochastic model;
   wherein discretizing the continuous time stochastic linear model to create the discrete-time linear stochastic model with the optimized parameters while maintaining an extent to which a variable affects the discrete-time linear stochastic model further comprises:
   parameterizing the discrete time stochastic model using the continuous time model parameters;
   utilizing a prediction error method with measured data and the continuous time linear gray-box model to estimate unknown parameters;
   wherein the prediction error is determined by solving Ricati's equation to compute the prediction error using the optimized vector of parameters by:
   defining an initial estimate of all the unknown parameters that define a vector of deterministic parameters θ, a discretized process noise matrix Q, measurement noise matrix R, and initial state of the model x;
   selecting a prediction error cost function; and
   iteratively looking for an optimal value of the unknown parameters that minimizes the prediction error cost function.

3. A controller having a parameterized model for controlling a system to perform a process comprising:
   a processor; and
   a storage device having code and data to define a dynamic time nonlinear gray-box model of the system and corresponding dynamic gray-box parameters for the gray-box model, wherein the dynamic gray-box parameters are determined in accordance with a method at least partially performed by a programmed computer, the method comprising:
   using first principles and engineering knowledge to define the dynamic time nonlinear gray-box model of a system performing a process and to determine a linear time-invariant (LTI) gray-box model deterministic structure, wherein the first principles comprise assumptions from laws of physics of the system and the engineering knowledge comprises empirical laws discovered by observation of the system:
   defining a numerically tractable optimization problem for parameter estimation of the dynamic time nonlinear gray-box model, wherein the numerically tractable optimization problem for parameter estimation comprises a problem that can be defined by a system of equations;
   performing a steady-state model estimation to obtain a vector of steady state parameters for a non-linear model representative of a system controlled by the controller;
   tuning the vector of steady-state parameters for optimizing by a using local approximation for estimation of non-linear model parameters at different operating levels of the system to obtain local linear model vectors of gray-box parameters for the controller;

extending the vector of parameters of the static model to the dynamic time nonlinear gray-box model by fitting measured transient data from the process;
providing the local linear model vectors of gray-box parameters to the controller; and
controlling the system using the local linear model vectors of gray-box parameters;
wherein fitting measured transient data uses a local linear approximation of the dynamic time nonlinear gray-box model, and thus avoiding computationally expensive numerical integration, and wherein the method further comprises providing analytical sensitivity to the optimized parameters wherein the analytical sensitivity is provided as a gradient of a cost function, wherein the gradient is computed using prediction errors and the analytical sensitivity to the optimized parameters, wherein the analytical sensitivity comprises a measure of how output of the model of the system changes with changes in the optimized parameters, and wherein the prediction errors and the analytical sensitivity comprise a deviation from a predicted outcome and a change in an input or an output of the optimized dynamic time nonlinear gray-box model;
and further comprising evaluating the computation of the prediction errors and the analytical sensitivity of locally linearized gray-box models corresponding to local linearized models of the dynamic time nonlinear gray-box model using an extended discrete-time linear stochastic model, wherein the, locally linearized gray-box models are defined by a set of first order stochastic differential equations;

$$dx(t)=A(\theta)x(t)dt+B(\theta)u(t)dt+dv(t),$$

$$y(t_k)=C(\theta)x(t_k)+D(\theta)u(t_k)+w(t_k),$$

where $x(t) \in R^{n_x}$ denotes system state, $u(t) \in R^{n_x}$ denotes system measured input, $y(t_k) \in R^{n_y}$—denotes system measured output, $\theta \in R^{n_p}$ denotes constant system parameters, $v(t) \in R^{n_x}$ is an $n_x$—dimensional Wiener process with $dv(t) \sim N(0, Q_c dt)$, $w(t_k) \in R^{n_y}$ is an $n_y$—dimensional white noise process with $w(t_k) \sim N(0, R)$, and A, B, C, and D are matrices of a deterministic description of the model:
and further comprising computing a discrete-time linear stochastic model using the continuous-time stochastic gray-box model wherein discretizing the extended continuous time stochastic linear model to create the discrete-time linear stochastic model parameterized by the vector of parameters while maintaining sensitivities of the discrete-time linear stochastic model includes:
generating discrete-time matrices; and
solving the discrete-time matrices using a matrix exponential to obtain the discrete-time linear stochastic model;
wherein discretizing the continuous time stochastic linear model to create the discrete-time linear stochastic model with the optimized vector of parameters while maintaining an extent to which a variable affects the discrete-time linear stochastic model further comprises:
parameterizing the discrete time stochastic model using the continuous time model parameters;
utilizing a prediction error method with measured data and the dynamic time linear gray-box model to estimate unknown parameters;
wherein the prediction error is determined by solving Ricati's equation to compute the prediction error using the optimized vector of parameters by:
defining an initial estimate of all the unknown parameters that define a vector of deterministic parameters θ, a discretized process noise matrix Q, measurement noise matrix R, and initial state of the model x;
selecting a prediction error cost function; and
iteratively looking for an optimal value of the unknown parameters that minimizes the prediction error cost function.

* * * * *